United States Patent
Morikawa

(10) Patent No.: US 6,710,638 B2
(45) Date of Patent: Mar. 23, 2004

(54) VOLTAGE CONVERSION CIRCUIT AND SEMICONDUCTOR DEVICE

(75) Inventor: Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/446,058

(22) Filed: May 28, 2003

(65) Prior Publication Data

US 2003/0222679 A1 Dec. 4, 2003

(30) Foreign Application Priority Data

May 28, 2002 (JP) .................................. 2002-154705

(51) Int. Cl.[7] ................................................. H03L 5/00
(52) U.S. Cl. ........................................................ 327/333
(58) Field of Search ................................. 327/185, 333, 327/319, 321, 322, 328, 427, 437; 326/56–58, 80, 81

(56) References Cited

U.S. PATENT DOCUMENTS

| | | | | |
|---|---|---|---|---|
| 5,670,905 A | * | 9/1997 | Keeth et al. ................ | 327/333 |
| 6,064,227 A | * | 5/2000 | Saito ............................ | 326/68 |
| 6,351,173 B1 | * | 2/2002 | Ovens et al. ................ | 327/333 |
| 6,459,299 B1 | * | 10/2002 | Hirano et al. ................ | 326/56 |
| 6,639,427 B2 | * | 10/2003 | Dray et al. .................... | 326/83 |

* cited by examiner

Primary Examiner—My-Trang Nuton
(74) Attorney, Agent, or Firm—Birch, Stewart, Kolasch & Birch, LLP

(57) ABSTRACT

A voltage conversion circuit for converting the voltage of an input signal to the voltage of an output signal is provided. The circuit comprises a logic circuit for outputting an operation signal obtained by inverting and delaying the input signal based on a stand-by/operation control signal and an inverted signal having a polarity inverse to the stand-by/operation control signal or a stand-by signal obtained by delaying the input signal relative to the inverted signal based on the inverted signal, and a voltage output circuit for starting generating the output signal based on the input signal and the inverted signal before receiving the operation signal or the stand-by signal output by the logic circuit.

9 Claims, 11 Drawing Sheets

US 6,710,638 B2

VOLTAGE CONVERSION CIRCUIT AND SEMICONDUCTOR DEVICE

This nonprovisional application claims priority under 35 U.S.C. §119(a) on Patent Application No. 2002-154705 filed in Japan on May 28, 2002, the entire disclosure of which is hereby incorporated by reference.

BACKGROUND OF THE INVENTION

1. Field of the Invention

The present invention relates to a voltage conversion circuit and a semiconductor device using the same. More particularly, the present invention relates to a voltage conversion circuit for converting signal voltage levels between circuits having different power source voltages and a semiconductor device using the same.

2. Description of the Related Art

Conventionally, when a signal is transferred between circuits having different power source voltages, a voltage conversion circuit (level shifter circuit) which converts the amplitude levels of signal voltages between these circuits is used as an interface circuit.

For example, the circuit configuration and operation of a voltage conversion circuit will be described below, which has a plurality of circuit sections comprising MOS transistors and driven by different power source voltages and which functions as an interface circuit.

FIG. 7 is a circuit diagram showing a voltage conversion circuit 100 which functions as the above-described interface circuit. The voltage conversion circuit 100 comprises an inverter circuit 70 and a voltage output circuit 80.

The power source voltage and reference voltage (LOW level) of the voltage output circuit 80 are VDD1 and VSS1, respectively. The power source voltage and reference voltage (LOW level) of the inverter circuit 70 are VDD2 and VSS1, respectively. Here, voltage conditions are VDD1>VDD2 and VSS1=VSS2=GND level. These conditions are referred to as voltage conditions A.

In the voltage output circuit 80, P-type MOS transistors 80c and 80d are connected in parallel. The source terminals of the P-type MOS transistor 80c and 80d are each connected to the power source voltage VDD1. The drain terminals of the P-type MOS transistors 80c and 80d are connected to the drain terminals of N-type MOS transistors 80a and 80b, respectively. The gate terminals of the P-type MOS transistors 80a and 80d are connected to the drain terminals of the N-type MOS transistors 80b and 80a, respectively. The drain terminals of the P-type MOS transistor 80d and the N-type MOS transistor 80b are the output terminal (output node B) of the voltage conversion circuit 100. The source terminals of the N-type MOS transistors 80a and 80b are each connected to VSS1=GND (earth). The gate terminal of the N-type MOS transistor 80a is connected to the input terminal of the inverter circuit 70. The gate terminal of the N-type MOS transistor 80b is connected to the output terminal of the inverter circuit 70.

The inverter circuit 70 comprises a P-type MOS transistor 70b and the N-type MOS transistor 70a. The drain and gate terminals of the P-type MOS transistor 70b are connected to the drain and gate terminals of the N-type MOS transistor 70a, respectively. The drain terminals of the P-type MOS transistor 70b and the N-type MOS transistor 70a are each the output terminal of the inverter circuit 70, while the gate terminals of the P-type MOS transistor 70b and the N-type MOS transistor 70a are each the input terminal of the inverter circuit 70. The input terminal of the inverter circuit 70 is the input terminal (input node A) of the voltage conversion circuit 100. The source terminals of the P-type MOS transistor 70b and the N-type MOS transistor 70a are connected to the power source voltage VDD2 and VSS2=GND (earth), respectively.

In the voltage conversion circuit 100 of FIG. 7, when a signal voltage A (HIGH level: VDD2, LOW level: VSS2) is input to the input node A, a signal voltage B (HIGH level: VDD1, LOW level: VSS1) is output through the output node B so that the HIGH level (VDD2) of the signal voltage A is converted to the HIGH level (VDD1) of the signal voltage B (voltage conversion). This operation will be described below in more detail. Note that the HIGH level and the LOW level are referred to as the H state and the L state, respectively.

It is now assumed that the input node A is in the H (VDD2) state. In this case, the input terminal of the inverter circuit 70 and the gate terminal of the N-type MOS transistor 80a of the voltage output circuit 80 are in the H state, and the N-type MOS transistor 80a is in the ON state. In this case, the output terminal of the inverter circuit 70 is in the L state, while the drain terminal of the N-type MOS transistor 80a is in the L state. When the output terminal of the inverter circuit 70 is in the L state, the gate terminal of the N-type MOS transistor 80b is in the L state, so that the N-type MOS transistor 80b is in the OFF state and the drain terminal of the N-type MOS transistor 80b is in the H state.

When the drain terminal of the N-type MOS transistor 80b is in the H state, the gate terminal of the P-type MOS transistor 80c is also in the H state and the P-type MOS transistor 80c is in the OFF state. In this case, the power source voltage VDD1 of the voltage output circuit 80 is not applied to the drain terminal of the N-type MOS transistor 80a, so that the drain terminal of the N-type MOS transistor 80a is maintained in the L state.

When the drain terminal of the N-type MOS transistor 80a is in the L state, the gate terminal of the P-type MOS transistor 80d is also in the L state, so that the P-type MOS transistor 80d is in the ON state. In this case, the power source voltage VDD1 of the voltage output circuit 80 is applied to the drain terminal of the N-type MOS transistor 80b. In this case, the N-type MOS transistor 80b is in the OFF state, while the H state (VDD1) of the drain terminal of the N-type MOS transistor 80b is output through the output terminal (output node B).

The same applies to the case where the input node A is in the L (VSS2) state. In this case, the output node B is in the L (VSS1) state, where VSS1=VSS2=GND.

Next, only an inverter circuit is provided between the circuits having different power source voltages instead of the voltage conversion circuit 100. The operation of this circuit 110 configuration will be described below with reference to FIG. 8.

The inverter circuit 110 of FIG. 8 comprises a P-type MOS transistor 90b and an N-type MOS transistor 90a. The drain and gate terminals of the P-type MOS transistor 90b are connected to the drain and gate terminals of the N-type MOS transistor 90a, respectively. The drain terminals of the P-type MOS transistor 90b and the N-type MOS transistor 90a are the output terminal (output node B) of the inverter circuit 110. The gate terminals of the P-type MOS transistor 90b and the N-type MOS transistor 90a are the input terminal (input node A) of the inverter circuit 110. The source terminals of the P-type MOS transistor 90b and the N-type MOS transistor 90a are connected to the power source voltage VDD1 and VSS1=GND (earth), respectively.

It is now assumed that a signal voltage A (H: VDD2, L: VSS2) satisfying the above-described voltage conditions A (VDD1>VDD2 and VSS1=VSS2=GND level) is applied to the input node A of the inverter circuit 110. The operation of the inverter circuit in this case will be described.

When a potential difference between VDD1 and VDD2 (=VDD1–VDD2) is less than a threshold voltage of the P-type MOS transistor 90b of FIG. 8, if an H state (VDD2) signal voltage A is input to the input node A, the P-type MOS transistor 90b is in the OFF state. In this case, the N-type MOS transistor 90a is in the ON state and the output node B is in the L state (VSS1). Alternatively, when an L state (VSS2) signal voltage A is input to the input node A, the P-type MOS transistor 90b is in the ON state and the N-type MOS transistor 90a is in the OFF state, so that the output node B is in the H state (VDD1). In this case, the inverter circuit is normally operated to perform voltage conversion (VDD2→VDD1) between the input node A and the output node B.

However, when the potential difference between VDD1 and VDD2 is greater than or equal to the threshold voltage of the P-type MOS transistor 90b in the inverter circuit 10 of FIG. 8, if the H state (VDD2) signal voltage A is input to the input node A, both the P-type MOS transistor 90b and the N-type MOS transistor 90a in the inverter circuit 110 of FIG. 8 are in the ON state. In this case, a current flows between the power source voltage VDD1 and VSS1 (earth). Therefore, in the CMOS transistor inverter circuit 110 comprising the P-type MOS transistor 90b and the N-type MOS transistor 90a, when the signal voltage A is in the H state, a current consistently flows between the power source voltage VDD1 and VSS1 (earth) and thus low power consumption drive cannot be achieved.

Therefore, in the circuits in FIGS. 7 and 8, the voltage output circuit 80 of FIG. 7 is required to achieve the operation that when the signal voltage A (H: VDD2, L: VSS2) satisfying the voltage conditions A is input to the input node A, the signal voltage B (H: VDD1, L: VSS1) is normally output through the output node B.

In recent years, there is a tendency to often use a circuit capable of operating under signal input conditions, such as the above-described voltage conditions A, for use in a system apparatus comprising a combination of IC chips having different power source voltages, and a system apparatus comprising voltage conversion circuits having different operational voltages, different functions, or the like, on one chip.

The voltage conversion circuit 100 of FIG. 7 is a circuit which has only a function of performing voltage conversion between the input voltage and the output voltage. In addition, the interface circuit may have a stand-by function, may be provided between voltage conversion circuit blocks having different functions on one chip, or the like. FIG. 9 is a circuit diagram showing an exemplary interface circuit (voltage conversion circuit 120) having a stand-by function.

The voltage conversion circuit 120 of FIG. 9 has a buffer circuit 50, a NOR circuit 60, an inverter circuit 70, and a voltage output circuit 80.

The AD terminal of the NOR circuit 60 is the input terminal of the voltage conversion circuit 120. The CEB terminal of the buffer circuit 50 is the control terminal of the voltage conversion circuit 120. The ADOUTB terminal of the voltage output circuit 80 is the output terminal of the voltage conversion circuit 120.

The voltage conversion circuit 120 controls an AD (address) signal (H state: VDD2, L state: VSS2), which is input to the AD terminal of the NOR circuit 60 (i.e., the input terminal of the voltage conversion circuit 120) and satisfies the above-described voltage conditions A, based on a CEB signal which is input to the CEB terminal of the buffer circuit 50. The voltage conversion circuit 120 outputs an ADOUTB signal (H state: VDD1, L state: VSS1), which is obtained by subjecting the AD signal to voltage conversion, through the ADOUTB terminal of the voltage output circuit 80 (i.e., the output terminal of the voltage conversion circuit 120. The CEB signal is a control signal which is used to switch the state of the voltage conversion circuit 120 between the stand-by state and the operation state. Note that the inverter circuit 70 and the voltage output circuit 80 have a circuit configuration similar to that of FIG. 7.

In the buffer circuit 50, two inverter circuits comprising CMOS transistors are connected in series. The inverter circuit at the first stage comprises a P-type MOS transistor 50b and an N-type MOS transistor 50a. The drain and gate terminals of the P-type MOS transistor 50b are connected to the drain and gate terminals of the N-type MOS transistor 50a. The drain terminals of the P-type MOS transistor 50b and the N-type MOS transistor 50a are each the output terminal of the first stage inverter circuit and are connected to the input terminal of the inverter circuit at the second stage. The gate terminals of the P-type MOS transistor 50b and the N-type MOS transistor 50a are each the input terminal of the buffer circuit 50, and function as a CEB terminal through which a switching signal (CEB signal) for switching between the stand-by state and the operation state is input. The source terminals of the P-type MOS transistor 50b and the N-type MOS transistor 50a are connected to the power source voltage VDD2 and VSS2=GND (earth), respectively.

The second stage inverter circuit also comprises a P-type MOS transistor 50d and an N-type MOS transistor 50c, and has connections similar to those in the first stage inverter circuit. The gate terminals of the P-type MOS transistor 50d and the N-type MOS transistor 50c are each the input terminal of the second stage inverter circuit and are connected to the output terminal of the first stage inverter circuit. The drain terminals of the P-type MOS transistor 50d and the N-type MOS transistor 50c are each the output terminal of the buffer circuit 50 and are each connected to a node A. The source terminals of the P-type MOS transistor 50d and the N-type MOS transistor 50c are connected to the power source voltage VDD2 and VSS2=GND (earth), respectively.

The NOR circuit 60 has P-type MOS transistors 60c and 60d connected to each other in series and N-type MOS transistors 60a and 60b connected to each other in parallel. The source and drain terminals of the P-type MOS transistor 60d are connected to the power source voltage VDD2 and the source terminal of the P-type MOS transistor 60c, respectively. The drain terminal of the P-type MOS transistor 60c is connected to the drain terminals of the N-type MOS transistor 60a and 60b. The drain terminal of the P-type MOS transistor 60c and the drain terminals of the N-type MOS transistors 60a and 60b are the output terminal of the NOR circuit 60 and are connected to a node B. The source terminals of the N-type MOS transistors 60a and 60b are each connected to VSS2=GND (earth). The gate terminal of the N-type MOS transistor 60a is connected to the output terminal of the buffer circuit 50 via the node A and to the gate terminal of the P-type MOS transistor 60c. The gate terminal of the N-type MOS transistor 60b is connected to the gate terminal of the P-type MOS transistor 60d and is the input terminal of the NOR circuit 60, which is an AD terminal through which an AD signal (address signal) is input as an input signal.

The output terminal of the NOR circuit 60 is connected via the node B to the input terminal of the inverter circuit 70 and the gate terminal of the N-type MOS transistor 80a in the voltage output circuit 80.

The inverter circuit 70 and the voltage output circuit 80 have a circuit configuration similar to the circuit shown in FIG. 7. The output terminal of the inverter circuit 70 is connected via a node C to the gate terminal of the N-type MOS transistor 80b in the voltage output circuit 80.

Next, the operation of the voltage conversion circuit 120 of FIG. 9 will be described below. The voltage conversion circuit 120 is in the operation state when the CEB signal input through the CEB terminal (control terminal) is in the L state; and is in the stand-by state when the CEB signal is in the H state.

When the CEB signal is in the H state (VDD2), the H state CEB signal is input to the input terminal of the buffer circuit 50 and an H state output signal is output through the output terminal of the buffer circuit 50. The H state output signal is input via the node A to the gate terminals of the P-type MOS transistor 60c and the N-type MOS transistor 60a in the NOR circuit 60. In this case, the P-type MOS transistor 60c goes to the OFF state, the N-type MOS transistor 60a goes to the ON state, and the drain terminal of the N-type MOS transistor 60a goes to the L state.

In this case, when the AD signal input to the AD terminal of the NOR circuit 60 is either in the H state or the L state, the output terminal of the NOR circuit 60 connected to the drain terminal of the N-type MOS transistor 60a is in the L state. Therefore, the L state output signal is output via the node B to the inverter circuit 70 and the voltage output circuit 80. When the inverter circuit 70 and the voltage output circuit 80 receive the L state signal, the output terminal (ADOUTB terminal) of the voltage output circuit 80 is in the L state as described for the operation of the voltage conversion circuit 100 of FIG. 7.

Therefore, in the voltage conversion circuit 120, if the CEB signal input to the CEB terminal (control terminal) is in the H state, the ADOUTB signal output through the ADOUTB terminal (output terminal) is consistently in the L state no matter whether the AD signal input to the AD terminal (input terminal) is in the H state or the L state, thereby maintaining the stand-by state of the voltage conversion circuit 120.

Next, when the CEB signal is in the L state (VSS2), the L state CEB signal is input to the input terminal of the buffer circuit 50 and an L state output signal is output through the output terminal of the buffer circuit 50. This L state output signal is input via the node A to the gate terminals of the P-type MOS transistor 60c and N-type MOS transistor 60a in the NOR circuit 60. In this case, the P-type MOS transistor 60c goes to the ON state and the N-type MOS transistor 60a goes to the OFF state.

In this case, if the AD signal input the AD terminal of the NOR circuit 60 is in the H state, the AD signal is input to the gate terminals of the P-type MOS transistor 60d and the N-type MOS transistor 60b. In this case, the P-type MOS transistor 60d goes to the OFF state and the drain terminal of the N-type MOS transistor 60b goes to the L state. When the drain terminal of the N-type MOS transistor 60b is in the L state, the output terminal of the NOR circuit 60 connected to the drain terminal of the N-type MOS transistor 60b is in the L state. In this case, an L state output signal is output via the node B to the inverter circuit 70 and the voltage output circuit 80. When the inverter circuit 70 and the voltage output circuit 80 receive the L state signal, the ADOUTB terminal (output terminal) of the voltage output circuit 80 goes to the L state.

When the AD signal input to the AD terminal of the NOR circuit 60 is in the L state, the P-type MOS transistor 60d is in the ON state and the N-type MOS transistor 60b is in the OFF state. In this case, the drain terminals of the N-type MOS transistor 60a and the N-type MOS transistor 60b are in the H state, and the P-type MOS transistor 60c and the P-type MOS transistor 60d are in the ON state. Therefore, the output terminal of the NOR circuit 60 connected to the drain terminals of the P-type MOS transistor 60c and the N-type MOS transistor 60b is supplied with the power source voltage VDD2 to be in the H state (VDD2), and an H state output signal is output via the node B to the inverter circuit 70 and the voltage output circuit 80. When the H state signal is input to the inverter circuit 70 and the voltage output circuit 80, the ADOUTB terminal (output terminal) of the voltage output circuit 80 goes to the H state as described for the operation of voltage conversion circuit 100 of FIG. 7.

Therefore, if the CEB signal input to the CEB terminal (control terminal) of the voltage conversion circuit 120 is in the L state, the ADOUTB signal output through the ADOUTB terminal (output terminal) is in the L state or the H state based on whether the AD signal input through the AD terminal (input terminal) is in the H state or in the L state, and the operation state of the voltage conversion circuit 120 is maintained.

FIG. 10 is a timing chart showing the CEB signal, the AD signal, the ADOUTB signal, and signals on the nodes A, B, C and D when the voltage conversion circuit 120 of FIG. 9 is released from the stand-by state (i.e., the circuit 120 goes to the operation state). Here, CEB, AD, ADOUTB, and Nodes A, B, C and D respectively indicate the signal waveforms of the CEB signal, the AD signal, the ADOUTB signal, and the signals on the node A, B, C and D (also referred to as node A signal, node B signal, node C signal and node D signal, respectively).

When the voltage conversion circuit 120 of FIG. 9 is released from the stand-by state, the CEB signal input to the buffer circuit 50 goes from the H state (VDD2) to the L state (VSS2=GND). In this case, the output signal of the buffer circuit 50 on the node A connected to the output terminal of the buffer circuit 50 goes from the H state to the L state where the transition is delayed by a delay time (2T) due to the buffer circuit 50, resulting in a signal waveform indicated by Node A in FIG. 10 (H state: VDD2, L state: GND).

In this case, it is assumed that the AD signal input to the NOR circuit 60 is fixed to the L state (VSS2=GND) as indicated by AD in FIG. 10. In this case, the output signal of the NOR circuit 60 on the node B connected to the output terminal of the NOR circuit 60 of FIG. 9 goes from the L state to the H state where the transition is delayed at a delay time (1T) due to the NOR circuit 60, resulting in a signal waveform indicated by Node B in FIG. 10 (H state: VDD2, L state: GND).

The output signal of the inverter circuit 70 on the node C connected to the output terminal of the inverter circuit 70 goes from the H state to the L state where the transition is delayed by a delay time (1T) due to the inverter circuit 70, resulting in a signal waveform indicated by Node C in FIG. 10 (H state: VDD2, L state: GND).

A signal on the node D connected to the drain terminal of the N-type MOS transistor 80a is changed based on the signal state on the node B input to the gate terminal of the N-type MOS transistor 80*a*, resulting in a signal waveform which changes from the H state to the L state as indicated by Node D in FIG. 10 (H state: VDD1, L state: GND).

The ADOUTB signal output through the ADOUTB terminal (output terminal) of the voltage conversion circuit 120 goes from the L state to the H state in accordance with the timing of the signal waveforms indicated by Node B and Node C in FIG. 10, resulting in a signal waveform indicated by ADOUTB in FIG. 10 (H state: VDD1, L state: GND).

As shown in FIG. 10, the signal on the node C is delayed by 1T relative to the signal on the node B. Therefore, in the operation of the voltage output circuit 80 (FIG. 9), the signal on the node B (FIG. 9) goes from the L state to the H state based on the output signal of the NOR circuit 60 and thus the N-type MOS transistor 80*a* goes from the OFF state to the ON state. When the N-type MOS transistor 80*a* goes to the ON state, the drain terminal of the N-type MOS transistor 80*a* goes to the L state, so that the signal on the node D of the voltage output circuit 80 goes from the H state (VDD1) to the L state (GND). Thereafter, when the signal on the node C (FIG. 9) goes from the H state to the L state based on the output signal of the inverter circuit 70, the N-type MOS transistor 80*b* goes from the ON state to the OFF state. When the N-type MOS transistor 80*b* goes from the ON state to the OFF state, the P-type MOS transistor 80*d* goes from the OFF state to the ON state in association with the transition of the signal on the above-described node D from the H state to the L state. In this case, the power source voltage VDD1 is applied to the drain terminal of the N-type MOS transistor 80*b*, the ADOUTB signal output from the ADOUTB terminal connected to the drain terminal goes from the L state (GND) to the H state (VDD1). In this case, the timing of the transition of the P-type MOS transistor 80*d* from the OFF state to the ON state is substantially the same as the timing of the transition of the N-type MOS transistor 80*b* from the ON state to the OFF state.

The transition of the ADOUTB signal in the voltage output circuit 80 from the L state to the H state starts from the transition starting point of the signal waveform on the node B in FIG. 10 from the L state to the H state. Therefore, the elapsed time from the starting point is a delay time (AT).

Therefore, when the voltage conversion circuit 120 is released from the stand-by state, the delay time between the release and the outputting of the ADOUTB signal through the ADOUTB terminal (output terminal) is 2T+AT as indicated by the signal waveform (ADOUTB) in FIG. 10. This delay time starts at the time when the CEB signal reaches a voltage value of (VDD2)/2 from the H state and ends at the time when the ADOUTB signal reaches a voltage value of (VDD1)/2 from the L state.

When the AD signal input to the NOR circuit 60 is fixed to the H state (VDD2), the ADOUTB signal is consistently in the L state. In this case, there is no delay time between the release of the voltage conversion circuit 120 from the stand-by state and the outputting of the ADOUTB signal through the ADOUTB terminal (output terminal).

Therefore, the delay time between the release of the voltage conversion circuit 120 from the stand-by state and the outputting of the ADOUTB signal through the ADOUTB terminal (output terminal) is 2T+AT at most (worst case).

Next, it is now assumed in the voltage conversion circuit 120 of FIG. 9, after releasing the voltage conversion circuit 120 from the stand-by state, the CEB signal input to the buffer circuit 50 is maintained in the L state and the AD signal input to the NOR circuit 60 goes from the L state to the H state.

FIG. 11 is a timing chart showing the CEB signal, the AD signal, the ADOUTB signal and signals on the nodes A, B, C and D when the AD signal goes from the L state to the H state after the voltage conversion circuit 120 is released from the stand-by state. Here, CEB, AD, ADOUTB and Nodes A, B, C and D indicate the signal waveforms of the CEB signal, the AD signal, the ADOUTB signal and signals on the nodes A, B, C and D, respectively.

The CEB signal is fixed to the L state (GND) since the voltage conversion circuit 120 has been released from the stand-by state, as indicated by CEB in FIG. 11.

The signal on the node A is in the L state because of the L state (GND) CEB signal and therefore has no delay time, resulting in a signal waveform indicated by Node A in FIG. 11 (L state: GND).

The AD signal has a signal waveform which transitions from the L state to the H state (H state: VDD2, L state: GND) as indicated by AD in FIG. 11.

The signal on the node B goes from the H state to the L state where the transition is delayed by a delay time (1T) due to the NOR circuit 60 which receives the AD signal, resulting in a signal waveform indicated by Node B in FIG. 11 (H state: VDD2, L state: GND).

The signal on the node C goes from the L state to the H state where the transition is delayed by a delay time (1T) due to the inverter circuit 70, resulting in a signal waveform indicated by Node C in FIG. 11 (H state: VDD2, L state: GND).

The signal on the node D is transitioned based on the switching of the N-type MOS transistor 80*a*, resulting in a signal waveform which transitions from the L state to the H state as indicated by Node D in FIG. 11 (H state: VDD1, L state: GND).

The ADOUTB signal is transitioned in accordance with the timings of the signal waveforms indicated by Node B and Node C in FIG. 11, resulting in a signal waveform which transitions from the H state to the L state as indicated by ADOUTB in FIG. 11 (H state: VDD1, L state: GND).

As indicated in FIG. 11, the signal on the node C is delayed by 1T relative to the signal on the node B. Therefore, in the operation of the voltage output circuit 80 of FIG. 9, the signal on the node B (FIG. 9) is first transitioned from the H state to the L state based on the output signal of the NOR circuit 60, whereby the N-type MOS transistor 80*a* goes from the ON state to the OFF state. In this case, the ADOUTB signal output through the ADOUTB terminal of the voltage output circuit 80 is in the H state, and therefore, the N-type MOS transistor 80*a* and the P-type MOS transistor 80*c* are in the OFF state. As a result, the signal on the node D in the voltage output circuit 80 is in the floating state. Note that since nowhere supplies a current to the node D, the signal on the node D is maintained in the L state.

Thereafter, when the signal on the node C (FIG. 9) goes from the L state to the H state based on the output signal of the inverter circuit 70, the N-type MOS transistor 80*b* goes from the OFF state to the ON state. Here, for the first time, the ADOUTB signal goes from the H state to the L state. When the ADOUTB signal goes from the H state to the L state, the P-type MOS transistor 80*c* goes from the OFF state to the ON state and the signal on the node D, which has been in the floating state, goes from the L state to the H state. When the signal on the node D goes from the L state to the H state, the P-type MOS transistor 80*d* goes from the ON state to the OFF state, resulting in acceleration of the transition of the ADOUTB signal from the H state to the L state.

The transition of the ADOUTB signal in the voltage output circuit 80 from the H state to the L state starts from the transition starting point of the signal waveform indicated by Node C in FIG. 11 from the L state to the H state. Therefore, the elapsed time from this starting point is a delay time (BT).

Therefore, when only the AD signal input through the AD terminal (input terminal) goes from the L state to the H state after the voltage conversion circuit 120 has been released from the stand-by state, the delay time between the release and the outputting of the ADOUTB signal through the ADOUTB terminal (output terminal) is 1T+BT as indicated by the signal waveform (ADOUTB) in FIG. 11. This delay time starts at the time when the transition of the signal on the node B from the H state to the L state is started and ends at the time when the ADOUTB signal reaches a voltage value of (VDD1)/2 from the H state.

Next, it is assumed that in the voltage conversion circuit 120 (FIG. 9), after releasing the voltage conversion circuit 120 from the stand-by state, the CEB signal input to the buffer circuit 50 is maintained in the L state and the AD signal input to the NOR circuit 60 goes from the H state to the L state.

FIG. 12 is a timing chart showing the CEB signal, the AD signal, the ADOUTB signal and signals on the nodes A, B, C and D when the AD signal goes from the H state to the L state after the voltage conversion circuit 120 has been released from the stand-by state. Here, CEB, AD, ADOUTB, and Nodes A, B, C and D indicate the signal waveforms of the CEB signal, the AD signal, the ADOUTB signal, and signals on the nodes A, B, C and D, respectively.

Since the CEB signal is fixed to the L state (GND) because of the release of the voltage conversion circuit 120 from the stand-by state, as indicated by CEB in FIG. 12.

Since the CEB is maintained in the signal in the L state (GND), the signal on the node A is in the L state and therefore there is no delay time, resulting in a signal waveform indicated by Node A in FIG. 12 (L state: GND).

The AD signal has a signal waveform which transitions from the H state to the L state as indicated by AD in FIG. 12 (H state: VDD2, L state: GND).

The signal on the node B has a signal waveform in which the signal goes from the L state to the H state as indicated by Node B in FIG. 12 where the transition is delayed by a delay time (1T) due to the NOR circuit 60 which receives the AD signal (H state: VDD2, L state: GND).

The signal on the node C has a signal waveform in which the signal goes from the H state to the L state as indicated by Node C in FIG. 12 where the transition is delayed by a delay time (1T) due to the inverter circuit 70 (H state: VDD2, L state: GND).

The signal on the node D is changed based on the switching of the N-type MOS transistor 80*a*, resulting in a signal waveform which transitions from the H state to the L state as indicated by Node D in FIG. 12 (H state: VDD1, L state: GND).

The ADOUTB signal is changed in accordance with the timings of the signal waveforms indicated by Node B and Node C in FIG. 12, resulting in a signal waveform which transitions from the L state to the H state as indicated by ADOUTB in FIG. 12 (H state: VDD1, L state: GND).

As shown in FIG. 12, the signal on the node C is delayed by 1T relative to the signal on the node B. Therefore, in the operation of the voltage output circuit 80 (FIG. 9), when the signal on the node B is first transitioned from the L state to the H state based on the output signal of the NOR circuit 60, the N-type MOS transistor 80*a* goes from the OFF state to the ON state. When the N-type MOS transistor 80*a* goes to the ON state, the drain terminal of the N-type MOS transistor 80*a* goes to the L state, so that the signal on the node D in the voltage output circuit 80 goes from the H state (VDD1) to the L state (GND). Thereafter, when the signal on the node C (FIG. 9) goes from the H state to the L state based on the output signal of the inverter circuit 70, the N-type MOS transistor 80*b* goes from the ON state to the OFF state. When the N-type MOS transistor 80*b* goes from the ON state to the OFF state, the P-type MOS transistor 80*d* goes from the OFF state to the ON state in association with the transition of the signal on the node D from the H state to the L state. In this case, the power source voltage VDD1 is applied to the drain terminal of the N-type MOS transistor 80*b* and the ADOUTB signal output through the ADOUTB terminal connected to the drain terminal goes from the L state (GND) to the H state (VDD1). The timing of the transition of the P-type MOS transistor 80*d* from the OFF state to the ON state is substantially the same as the timing of the transition of the N-type MOS transistor 80*b* from the ON state to the OFF state, as in the case when the voltage conversion circuit 120 is released from the stand-by state (FIG. 10).

As shown in FIG. 12, the relationship between the signal waveform of the node B and the signal waveform of the node C is such that when the signal waveform of the node B goes from the L state to the H state, the signal waveform of the the node C goes from the H state to the L state based on the transition of the signal waveform of the node B. Thus, the input state of the signal to the voltage output circuit 80 (FIG. 9) is similar to when the voltage conversion circuit 120 is released from the stand-by state (FIG. 10), and therefore, the delay time of the transition of the ADOUTB signal from the L state to the H state is AT.

Therefore, when only the AD signal input through the AD terminal (input terminal) goes from the H state to the L state after the voltage conversion circuit 120 has been released from the stand-by state, the delay time between the release and the outputting of the ADOUTB signal through the ADOUTB terminal (output terminal) is 1T+AT as indicated by the signal waveform (ADOUTB) of FIG. 12. This delay time starts at the time when the transition starting point of the signal on the node B from the L state to the H state is started and ends at when the ADOUTB signal reaches a voltage of (VDD1)/2 from the L state.

The ADOUTB signal and the node D signal indicated by ADOUTB and Node D, respectively, in FIGS. 10, 11 and 12 have opposite voltage polarities. If the signal on the node D in the voltage output circuit 80 is assumed to be the output signal of the voltage conversion circuit 120, the delay time of the node D signal is greater than the delay time of the ADOUTB signal as indicated in FIGS. 11 and 12. This is because the delay time (1T+BT) of the ADOUTB signal going from the H state to the L state (FIG. 11) is substantially the same as the delay time (1T+AT) of the ADOUTB signal going from the L state to the H state (FIG. 12), and therefore, the delay time of the Node D signal going from the L state to the H state is longest. Considering both FIGS. 11 and 12, the delay time of the Node D signal is longer than the delay time of the ADOUTB signal. Therefore, it is not preferable to use the node D signal as the output signal of the voltage conversion circuit 120. Therefore, the ADOUTB signal output through the ADOUTB terminal is used as the output signal of the voltage conversion circuit 120, since when all of the delay time occurred in the release of the voltage conversion circuit 120 from the stand-by state, the delay time occurred in the transition of the AD signal from the L state to the H state after the release of the voltage conversion circuit 120 from the stand-by state, and the delay time occurred in the transition of the AD signal from the H state to the L state, are considered, the delay time of the ADOUTB signal is shorter than the delay time of the Node D signal.

In the voltage conversion circuit 120 (FIG. 9), when the voltage conversion circuit 120 is released from the stand-by state as well as when only the AD signal (address signal) is transitioned to the H or L state after the release of the voltage conversion circuit 120 from the stand-by state, a delay time occurs in the output signal of the voltage conversion circuit 120 as described above. A reduction in this delay time is much required. For example, in general semiconductor memory devices in which an address signal is input and data is output as an output signal, by reducing an access time in the semiconductor memory device, data can be read out at high speed.

However, in the voltage conversion circuit 120 shown in FIG. 9, a large delay time occurs in the output signal of the voltage conversion circuit 120 in an access that the voltage conversion circuit 120 is released from the stand-by state as well as in an access that only an address signal is transitioned to the H or L state after the release of the voltage conversion circuit 120 from the stand-by state. Therefore, when the voltage conversion circuit 120 is used in semiconductor devices, such as semiconductor memory devices, high-speed data read is unlikely to be achieved.

SUMMARY OF THE INVENTION

According to an aspect of the present invention, a voltage conversion circuit for converting the voltage of an input signal to the voltage of an output signal is provided. The circuit comprises a logic circuit for outputting an operation signal obtained by inverting and delaying the input signal based on a stand-by/operation control signal and an inverted signal having a polarity inverse to the stand-by/operation control signal or a stand-by signal obtained by delaying the input signal relative to the inverted signal based on the inverted signal; and a voltage output circuit for starting generating the output signal based on the input signal and the inverted signal before receiving the operation signal or the stand-by signal output by the logic circuit.

In one embodiment of this invention, the voltage conversion circuit further comprises a control circuit for generating the stand-by/operation control signal.

In one embodiment of this invention, the voltage conversion circuit further comprises an inversion circuit for generating the inverted signal by inverting the stand-by/operation control signal.

In one embodiment of this invention, the control circuit comprises a first inversion control circuit for generating the inverted signal; and a second inversion control circuit for generating the stand-by/operation control signal by inverting the inverted signal.

In one embodiment of this invention, the logic circuit comprises a ternary logic circuit for generating the operation signal corresponding to the input signal based on the stand-by/operation control signal and the inverted signal; and a pull-up circuit for generating the stand-by signal based on the inverted signal.

In one embodiment of this invention, the ternary logic circuit comprises a first P-type MOS transistor having a gate terminal through which the input signal is input, a source terminal, and a drain terminal; a second P-type MOS transistor having a gate terminal through which the stand-by/operation signal is input, a source terminal connected to a power source, and a drain terminal connected to the source terminal of the first P-type MOS transistor; a first N-type MOS transistor having a gate terminal through which the input signal is input, a source terminal, and a drain terminal connected to the drain terminal of the first P-type MOS transistor; and a second N-type MOS transistor having a gate terminal through which the inverted signal is input, a source terminal connected to ground, and a drain terminal connected to the source terminal of the first N-type MOS transistor. The first P-type MOS transistor and the first N-type MOS transistor function as a CMOS inverter.

In one embodiment of this invention, the voltage output circuit comprises a third P-type MOS transistor having a gate terminal, a source terminal connected to a power source, and a drain terminal; a fourth P-type MOS transistor having a gate terminal, a source terminal connected to the power source, and a drain terminal connected to the gate terminal of the third P-type MOS transistor; a third N-type MOS transistor having a gate terminal through which the inverted signal is input, a source terminal, and a drain terminal connected to the drain terminal of the third P-type MOS transistor; a fourth N-type MOS transistor having a gate terminal through which the input signal is input, a source terminal connected to ground, and a drain terminal connected to the source terminal of the third N-type MOS transistor; and a fifth N-type MOS transistor having a gate terminal through which the operation signal or the stand-by signal is input, a source terminal connected to ground, and a drain terminal connected to the drain terminal of the third P-type MOS transistor.

In one embodiment of this invention, the voltage output circuit further comprises a first output terminal and a second terminal; and the polarity of an output signal output through the first output terminal is opposite to the polarity of an output signal output through the second output terminal.

According to another aspect of the present invention, a semiconductor device incorporating the above-described voltage conversion circuit is provided.

Functions of the above-described configuration will be described below.

In the voltage conversion circuit of the present invention, the voltage output circuit starts generating an output signal based on an input signal and an inverted signal before receiving an operation signal or a stand-by signal output by the logic circuit. Thus, the signal waveform of an output signal of the voltage conversion circuit starts transition in response to the transition of the signal waveforms of the input signal and the inverted signal, thereby making it possible to reduce a delay time.

Thus, the invention described herein makes possible the advantages of providing a voltage conversion circuit having a reduced delay time of a signal between input and output terminals and a semiconductor device using the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
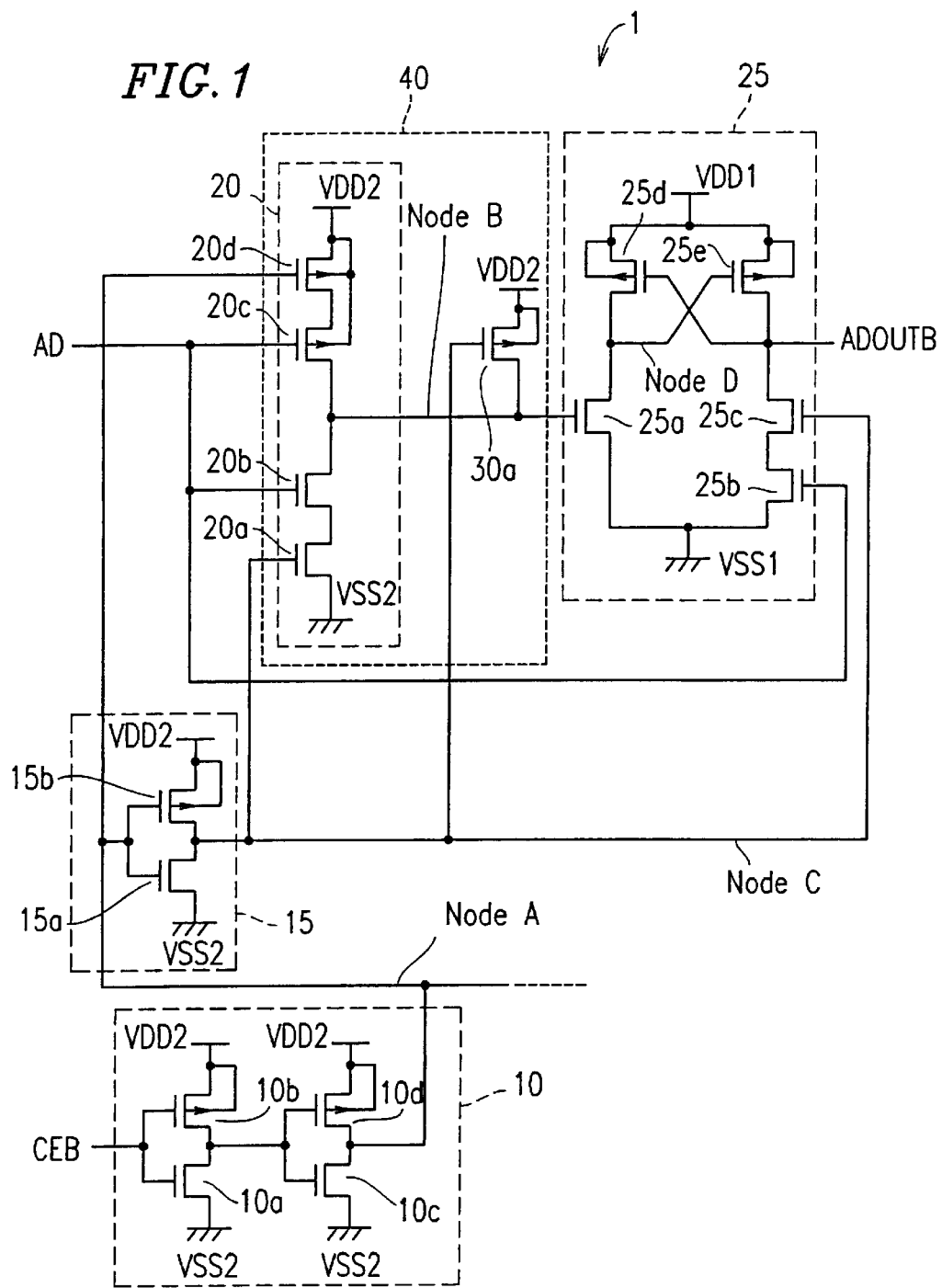
FIG. 1 is a circuit diagram showing a voltage conversion circuit according to an embodiment of the present invention.

FIG. 1 is a circuit diagram showing a voltage conversion circuit 1 according to an embodiment of the present invention.

The voltage conversion circuit 1 of the present invention of FIG. 1 has a stand-by function and comprises a buffer circuit 10 (control circuit), an inverter circuit 15 (inversion circuit), a tristate circuit 20 (ternary logic circuit) whose output takes an H state, an L state, or a high impedance state, a voltage output circuit 25 which converts an input signal voltage to a predetermined voltage, and a pull-up P-type MOS transistor 30a (pull-up circuit). In the voltage conversion circuit 1, the logic circuit 40 comprises a voltage output circuit 25 and a pull-up circuit 30a.

The voltage conversion circuit 1 of the present invention controls an AD (address) signal (H state: VDD2, L state: VSS2) satisfying the above-described voltage conditions A, which is input through the AD terminal of the tristate circuit 20, based on a CEB signal input to the CEB terminal of the buffer circuit 10 and outputs an ADOUTB signal (H state: VDD1, L state: VSS1), which is obtained by voltage conversion of the AD signal, through the ADOUTB terminal of the voltage output circuit 25, with a minimum delay time.

The AD terminal of the tristate circuit 20 is the input terminal of the voltage conversion circuit 1. The CEB terminal of the buffer circuit 10 is the control terminal of the voltage conversion circuit 1. The ADOUTB terminal of the voltage output circuit 25 is the output terminal of the voltage conversion circuit 1.

The CEB signal is a control signal which is used by the voltage conversion circuit 1 to switch between the stand-by state and the operation state.

The buffer circuit 10 comprises two inverter circuits connected in series, each of which has a CMOS transistor.

The first stage inverter circuit (first inversion control circuit) comprises a P-type MOS transistor 10b and an N-type MOS transistor 10a. The drain and gate terminals of the P-type MOS transistor 10b are connected to the drain and gate terminals of the N-type MOS transistor 10a, respectively. The drain terminals of the P-type MOS transistor 10b and the N-type MOS transistor 10a are each the output terminal of the first stage inverter circuit and are connected to the input terminal of the second stage inverter circuit. The gate terminals of the P-type MOS transistor 10b and the N-type MOS transistor 10a are each the input terminal of the buffer circuit 10 and the CEB terminal into which the CEB signal for switching between the stand-by state and the operation state is input. The source terminals of the P-type MOS transistor 10b and the N-type MOS transistor 10a are each connected to a power source voltage VDD2 and VSS2=GND (earth).

The second stage inverter circuit (second inversion control circuit) also comprises a P-type MOS transistor 10d and an N-type MOS transistor 10c, and has connections similar to those in the first stage inverter circuit. The gate terminals of the P-type MOS transistor 10d and the N-type MOS transistor 10c are each the input terminal of the second stage inverter circuit and are each connected to the output terminal of the first stage inverter circuit. The drain terminals of the P-type MOS transistor 10d and the N-type MOS transistor 10c are each the output terminal of the buffer circuit 10 and are each connected to a node A. The source terminals of the P-type MOS transistor 10d and the N-type MOS transistor 10c are connected to the power source voltage VDD2 and VSS2=GND (earth), respectively.

The inverter circuit 15 comprises a P-type MOS transistor 15b and an N-type MOS transistor 15a. The drain and gate terminals of the P-type MOS transistor 15b are connected to the drain and gate terminals of the N-type MOS transistor 15a, respectively. The drain terminals of the P-type MOS transistor 15b and the N-type MOS transistor 15a are each the output terminal of the inverter circuit 15. The gate terminals of the P-type MOS transistor 15b and the N-type MOS transistor 15a are each the input terminal of the inverter circuit 15. The output terminal of the inverter circuit 15 is connected via a node C to the gate terminal of an N-type MOS transistor 20a of the tristate circuit 20, the gate terminal of the pull-up P-type MOS transistor 30a, and the gate terminal of an N-type MOS transistor 25c of the voltage output circuit 25. The input terminal of the inverter circuit 15 is connected via the node A to the output terminal of the buffer circuit 10 and the gate terminal of a P-type MOS transistor 20d of the tristate circuit 20. The source terminals of the P-type MOS transistor 15b and the N-type MOS transistor 15a are connected to the power source voltage VDD2 and VSS2 (GND: earth), respectively.

The tristate circuit 20 comprises an N-type MOS transistor 20a, an N-type MOS transistor 20b, a P-type MOS transistor 20c, and a P-type MOS transistor 20d. The P-type MOS transistor 20c and the N-type MOS transistor 20b, form a CMOS transistor. The P-type MOS transistor 20d and the N-type MOS transistor 20a are connected to the source terminals of the P-type MOS transistor 20c and the N-type MOS transistor 20b, respectively.

The drain and gate terminals of the P-type MOS transistor 20c are connected to the drain and gate terminals of the N-type MOS transistor 20b, respectively. The drain terminals of the P-type MOS transistor 20c and the N-type MOS transistor 20b are each the output terminal of the tristate circuit 20. The gate terminals of the P-type MOS transistor 20c and the N-type MOS transistor 20b are each the input terminal of the tristate circuit 20. The output terminal of the tristate circuit 20 is connected via a node B to the drain terminal of the pull-up P-type MOS transistor 30a and the gate terminal of the N-type MOS transistor 25a of the voltage output circuit 25. The input terminal of the tristate circuit 20 is the AD terminal through which an AD signal (address signal) is input, and is connected to the gate terminal of an N-type MOS transistor 25b in the voltage output circuit 25.

The source terminals of the P-type MOS transistor 20c and the N-type MOS transistor 20b are connected to the drain terminals of the P-type MOS transistor 20d and the N-type MOS transistor 20a, respectively. The source and gate terminals of the P-type MOS transistor 20d are connected to the power source voltage VDD2 and the input terminal of the inverter circuit 15, respectively. The source and gate terminals of the N-type MOS transistor 20a are connected to VSS2 (GND: earth) and the output terminal of the inverter circuit 15, respectively.

The source terminal of the pull-up P-type MOS transistor 30a, which pulls up the node B to the power source voltage VDD2, is connected to the power source voltage VDD2, and the drain and gate terminals thereof are connected to the node B and the node C, respectively.

The voltage output circuit 25 comprises a P-type MOS transistors 25d and 25e, which are connected in parallel. The source terminals of the P-type MOS transistors 25d and 25e are each connected to a power source voltage VDD1. The drain terminals of the P-type MOS transistors 25d and 25e are connected to the drain terminal of the N-type MOS transistors 25a and 25c, respectively. The gate terminals of the P-type MOS transistors 25d and 25e are connected to the drain terminals of the N-type MOS transistors 25c and 25a, respectively. The source terminal of the N-type MOS transistor 25c is connected to the drain terminal of the N-type MOS transistor 25b. The drain terminals of the P-type MOS transistor 25e and the N-type MOS transistor 25c are each the ADOUTB terminal (output terminal) of the voltage conversion circuit 1. The source terminals of the N-type MOS transistors 25a and 25b are each connected to VSS1 (GND: earth). The gate terminals of the N-type MOS transistors 25a and 25c are connected via the node B and the node C, respectively, to the output terminals of the tristate circuit 20 and the inverter circuit 15, respectively. The gate terminal of the N-type MOS transistor 25b is connected to the AD terminal (input terminal) of the tristate circuit 20.

Next, an operation of the voltage conversion circuit 1 of the present invention of FIG. 1 will be described. The voltage conversion circuit 1 is in the operation state when the CEB signal input through the CEB terminal (control terminal) is in the L state, and is in the stand-by state when the CEB signal is in the H state.

When the CEB signal is in the H state (VDD2), the H state CEB signal is input to the input terminal of the buffer circuit 10 and an H state output signal (stand-by/operation control signal) is output through the output terminal of the buffer circuit 10 comprising two CMOS transistors. The H state output signal is input via the node A to the input terminal of the inverter circuit 15 and the gate terminal of the P-type MOS transistor 20d in the tristate circuit 20. Therefore, the P-type MOS transistor 20d goes to the OFF state. Further, an L state output signal (first inverted signal) is output through the output terminal of the inverter circuit 15 into which the H state signal has been input. The L state output signal is input to the gate terminals of the N-type MOS transistor 20a in the tristate circuit 20, the N-type MOS transistor 25c in the voltage output circuit 25, and the pull-up P-type MOS transistor 30a. In this case, the N-type MOS transistor 20a and the N-type MOS transistor 25c go to the OFF state, while the pull-up P-type MOS transistor 30a goes to the ON state.

In this case, when the AD signal input to the AD terminal of the tristate circuit 20 is either in the H state or in the L state, the P-type MOS transistor 20d and the N-type MOS transistor 20a are in the OFF state, so that the output terminal of the tristate circuit 20 connected to the drain terminals of the P-type MOS transistor 20c and the N-type MOS transistor 20b are in the high impedance state. Therefore, the output state of the tristate circuit 20 is fixed to the high impedance state. However, since the node B is maintained in the H state by the P-type MOS transistor 30a, an H state signal (stand-by signal) is input to the gate terminal of the N-type MOS transistor 25a in the voltage output circuit 25.

When the gate terminal of the N-type MOS transistor 25a goes to the H state, the N-type MOS transistor 25a goes to the ON state and the drain terminal of the N-type MOS transistor 25a goes to the L state. In this case, the gate terminal of the N-type MOS transistor 25c receives the L state output signal output by the inverter circuit 15 via the node C, while the H state or L state AD signal is input via the AD terminal to the gate terminal of the N-type MOS transistor 25b. Therefore, the N-type MOS transistor 25c goes to the OFF state, while the N-type MOS transistor 25b goes to the ON state or the OFF state in accordance with the AD signal. Thus, the drain terminal of the N-type MOS transistor 25c is maintained in the H state no matter whether the N-type MOS transistor 25b is in the ON state or in the OFF state.

When the drain terminal of the N-type MOS transistor 25c goes to the H state, the gate terminal of the P-type MOS transistor 25d also goes to the H state, so that the P-type MOS transistor 25d goes to the OFF state. Therefore, the power source voltage VDD1 of the voltage output circuit 25 is not applied to the drain terminal of the N-type MOS transistor 25a, so that the drain terminal of the N-type MOS transistor 25a is maintained in the L state.

When the drain terminal of the N-type MOS transistor 25a goes to the L state, the gate terminal of the P-type MOS transistor 25e goes to the L state via the node D, so that the P-type MOS transistor 25e goes to the ON state. Therefore, the power source voltage VDD1 of the voltage output circuit 25 is applied to the drain terminal of the N-type MOS transistor 25c. In this case, since the N-type MOS transistor 25c is in the OFF state, an H state (VDD1) signal is output through the ADOUTB terminal of the voltage output circuit 25 connected to the drain terminal of the N-type MOS transistor 25c.

Therefore, in the voltage conversion circuit 1, if the CEB signal input to the CEB terminal (control terminal) is in the H state, the ADOUTB signal output through the ADOUTB terminal (output terminal) is consistently in the H state no matter whether the AD signal input to the AD terminal (input terminal) is in the H state or in the L state, so that the voltage conversion circuit 1 is maintained in the stand-by state.

Next, when the CEB signal is in the L state (VSS2), the L state CEB signal is input to the CEB terminal (input terminal) of the buffer circuit 10, so that an L state output signal is output through the output terminal of the buffer circuit 10. This L state output signal is input via the node A to the input terminal of the inverter circuit 15 and the gate terminal of the P-type MOS transistor 20d in the tristate circuit 20. In this case, an H state output signal is output through the output terminal of the inverter circuit 15. This H state output signal is input via the node C to the gate terminals of the N-type MOS transistor 20a in the tristate circuit 20, the N-type MOS transistor 25c in the voltage output circuit 25, and the pull-up P-type MOS transistor 30a, so that the N-type MOS transistor 20a and the N-type MOS transistor 25c go to the ON state, while the pull-up P-type MOS transistor 30a goes to the OFF state.

Further, the P-type MOS transistor 20d, which receives the L state signal through the gate terminal thereof, goes to the ON state. Therefore, both the N-type MOS transistor 20a and the P-type MOS transistor 20d in the tristate circuit 20 go to the ON state. The tristate circuit 20 outputs an output signal (operation signal) to the node B based on the AD signal input through the AD terminal (input terminal), which is in the H state or in the L state.

In this case, if the AD signal input to the AD terminal of the tristate circuit 20 is in the H state, the H state AD signal is input to the gate terminals of the P-type MOS transistor 20c and the N-type MOS transistor 20b and the gate terminal of the N-type MOS transistor 25b in the voltage output circuit 25. Since both the P-type MOS transistor 20d and the N-type MOS transistor 20a go to the ON state, the P-type MOS transistor 20c and the N-type MOS transistor 20b operate as a CMOS transistor, so that the N-type MOS transistor 25b also goes to the ON state. Therefore, an L state output signal is output through the output terminal of the tristate circuit 20 connected to the drain terminals of the P-type MOS transistor 20c and the N-type MOS transistor 20b. This L state output signal is input via the node B to the gate terminal of the N-type MOS transistor 25a in the voltage output circuit 25.

When the gate terminal of the N-type MOS transistor 25a goes to the L state, the N-type MOS transistor 25a goes to the OFF state and the drain terminal of the N-type MOS transistor 25a goes to the H state. In this case, an H state output signal from the inverter circuit 15 is input via the node C to the gate terminal of the input N-type MOS transistor 25c. Therefore, both the N-type MOS transistor 25c and the N-type MOS transistor 25b go to the ON state, while the drain terminal of the N-type MOS transistor 25c goes to the L state.

When the drain terminal of the N-type MOS transistor 25c goes to the L state, the gate terminal of the P-type MOS transistor 25d also goes to the L state, so that the P-type MOS transistor 25d goes to the ON state. Therefore, the power source voltage VDD1 of the voltage output circuit 25 is applied to the drain terminal of the N-type MOS transistor 25a, so that the node D is maintained in the H state. When the drain terminal of the N-type MOS transistor 25a goes to the H state, the gate terminal of the P-type MOS transistor 25e also goes to the H state via the node D, so that the P-type MOS transistor 25e goes to the OFF state. Therefore, the power source voltage VDD1 of the voltage output circuit 25 is not applied to the drain terminal of the N-type MOS transistor 25c, so that the drain terminal of the N-type MOS transistor 25c is maintained in the L state, so that an L state (VSS1) signal is output through the ADOUTB terminal of the voltage output circuit 25 connected to the drain terminal of the N-type MOS transistor 25c.

When the CEB signal is in the L state (VSS2), if the AD signal input to the AD terminal of the tristate circuit 20 is in the L state, the L state AD signal is input to the gate terminals of the P-type MOS transistor 20c and the N-type MOS transistor 20b and the gate terminal of the N-type MOS transistor 25b in the voltage output circuit 25. Since both the P-type MOS transistor 20d and the N-type MOS transistor 20a are in the ON state, the P-type MOS transistor 20c and the N-type MOS transistor 20b operate as a CMOS transistor, so that the N-type MOS transistor 25b goes to the OFF state. Therefore, an H state output signal is output through the output terminal of the tristate circuit 20 connected to the drain terminals of the P-type MOS transistor 20c and the N-type MOS transistor 20b. This H state output signal is input via the node B to the gate terminals of the N-type MOS transistor 25a in the voltage output circuit 25.

When the gate terminal of the N-type MOS transistor 25a goes to the H state, the N-type MOS transistor 25a goes to the ON state, so that the drain terminal of the N-type MOS transistor 25a goes to the L state. In this case, an H state output signal from the inverter circuit 15 is input via the node C to the gate terminal of the N-type MOS transistor 25c. Therefore, whereas the N-type MOS transistor 25c goes to the ON state, the N-type MOS transistor 25b goes to the OFF state, so that the drain terminal of the N-type MOS transistor 25c has the same potential as that of the drain terminal of the N-type MOS transistor 25b in the H state.

When the drain terminal of the N-type MOS transistor 25c goes to the H state, the gate terminal of the P-type MOS transistor 25d also goes to the H state, so that the P-type MOS transistor 25d goes to the OFF state. Therefore, the power source voltage VDD1 of the voltage output circuit 25 is not applied to the drain terminal of the N-type MOS transistor 25a, so that the drain terminal of the N-type MOS transistor 25a is maintained in the L state. When the drain terminal of the N-type MOS transistor 25a goes to the L state, the gate terminal of the P-type MOS transistor 25e also goes to the L state via the node D, so that the P-type MOS transistor 25e goes to the ON state. Therefore, the power source voltage VDD1 of the voltage output circuit 25 is applied to the drain terminal of the N-type MOS transistor 25c, so that an H state (VDD1) signal is output through the ADOUTB terminal of the voltage output circuit 25 connected to the drain terminal of the N-type MOS transistor 25c.

Therefore, in the voltage conversion circuit 1, if the CEB signal input to the CEB terminal (control terminal) is in the L state, the ADOUTB signal output through the ADOUTB terminal (output terminal) is in the L state or in the H state based on whether the AD signal input to the AD terminal (input terminal) in the H state or in the L state, so that the voltage conversion circuit 1 is maintained in the operation state.

Figure 2:
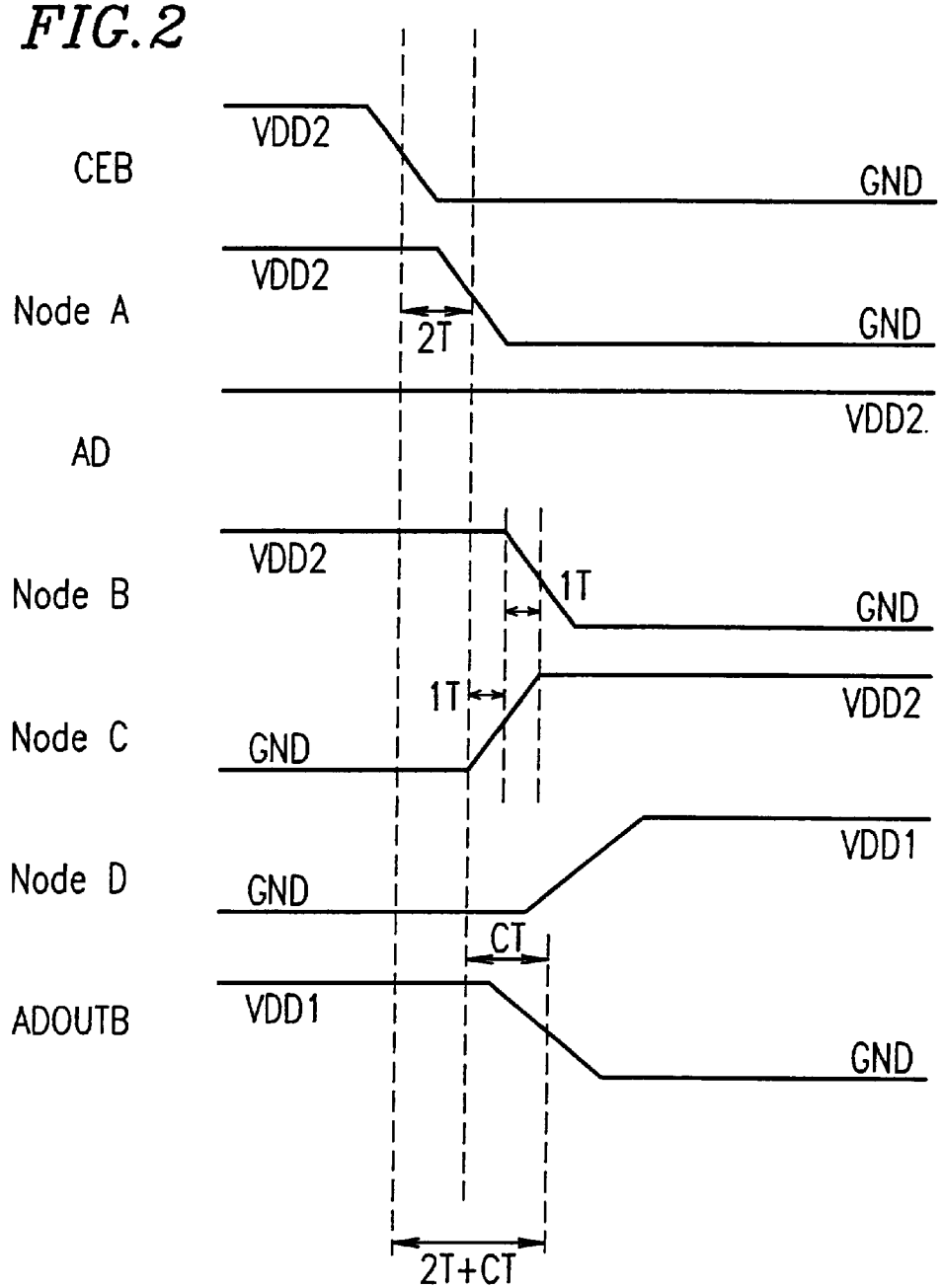
FIG. 2 is a timing chart of signals in the voltage conversion circuit of FIG. 1 in which the voltage conversion circuit is released from the stand-by state.

FIG. 2 is a timing chart of the CEB signal, the AD signal, the ADOUTB signal, and signals on the nodes A, B, C and D when the voltage conversion circuit 1 of FIG. 1 is released from the stand-by state. Here, CEB, AD, ADOUTB and Node A, B, C and D respectively indicate the signal waveforms of the CEB signal, the AD signal, the ADOUTB signal, and the signals on the nodes A, B, C and D (also referred to as node A signal, node B signal, node C signal and node D signal, respectively). The node A signal is a stand-by/operation control signal. The node B signal is a stand-by signal or an operation signal. The node C signal is a first inverted signal. The ADOUTB signal is a voltage conversion output signal.

When the voltage conversion circuit 1 of FIG. 1 is released from the stand-by state, the CEB signal input to the buffer circuit 10 goes from the H state (VDD2) to the L state (VSS2=GND). In this case, the output signal of the buffer circuit 10 on the node A connected to the output terminal of the buffer circuit 10 goes from the H state to the L state where the transition is delayed by a delay time (2T) due to the buffer circuit 10, resulting in a signal waveform indicated by Node A in FIG. 1 (H state: VDD2, L state: GND).

In this case, the AD signal input to the tristate circuit 20 is fixed to the H state (VDD2) as indicated by AD in FIG. 2.

In this case, an output signal on the node C connected to the output terminal of the inverter circuit 15 receiving the node A signal (FIG. 1) goes from the L state to the H state where the transition is delayed by a delay time (1T) due to the inverter circuit 15, resulting in a signal waveform indicated by Node C in FIG. 2 (H state: VDD2, L state: GND).

In response to the transition of the Node C signal waveform from the L state to the H state, an output signal on the node B connected to the output terminal of the tristate circuit 20 (FIG. 1) goes from the H state to the L state where the transition is delayed by a delay time (1T) due to tristate circuit 20 relative to the node C signal, resulting in a signal waveform indicated by Node B in FIG. 2 (H state: VDD2, L state: GND).

In response to the transition of the node B signal waveform from the H state to the L state, the signal on the node D connected to the drain terminal of the N-type MOS transistor 25a goes from the L state to the H state, resulting in a signal waveform indicated by Node D in FIG. 2 (H state: VDD1, L state: GND).

The ADOUTB signal output through the ADOUTB terminal (output terminal) of the voltage conversion circuit 1 goes from the H state to the L state in accordance with the timings of the signal waveforms indicated by Node B and Node C in FIG. 2, resulting in a signal waveform indicated by ADOUTB in FIG. 2 (H state: VDD1, L state: GND).

As shown in FIG. 2, the node B signal is delayed by 1T relative to the node C signal. In an operation of the voltage output circuit 25 (FIG. 1), initially, the H state AD signal is input to the gate terminal of the N-type MOS transistor 25b, and the N-type MOS transistor 25b goes to the ON state. Next, the node C signal goes from the L state to the H state based on the output signal of the inverter circuit 15, so that the N-type MOS transistor 25c goes from the OFF state to the ON state and the P-type MOS transistor 30a goes from the ON state to the OFF state. The P-type MOS transistor 30a goes to the OFF state, and has no influence on a change in the node B signal (the output signal of the tristate circuit 20). When the N-type MOS transistor 25b and the N-type MOS transistor 25c go to the ON state, the drain terminals of the N-type MOS transistor 25b and the N-type MOS transistor 25c go from the H state to the L state, so that the ADOUTB signal output through the ADOUTB terminal of the voltage output circuit 25 starts to be also transitioned from the H state (VDD1) to the L state (GND). In this case, the P-type MOS transistor 25d goes from the OFF state to the ON state. During this transition, the node B signal (the output signal of the tristate circuit 20) goes from the H state to the L state, and in association with this transition, the N-type MOS transistor 25a goes from the ON state to the OFF state and the signal on the node D connected to the drain terminal of the N-type MOS transistor 25a goes from the L state to the H state. As a result, the H state node D signal is input to the gate terminal of the P-type MOS transistor 25e, the P-type MOS transistor 25e goes from the ON state to the OFF state, and there is no current flowing through the P-type MOS transistor 25e, the N-type MOS transistor 25c and the N-type MOS transistor 25b between the power source voltage VDD1 and GND (VSS1).

As described above, the transition of the ADOUTB signal in the voltage output circuit 25 from the H state to the L state starts from the transition starting point of the Node C signal waveform from the L state to the H state in FIG. 2 irrespective of the delay time of the node B signal. Therefore, the elapsed time from the starting point is a delay time (CT).

Therefore, a delay time between the release of the voltage conversion circuit 1 from the stand-by state and the outputting of the ADOUTB signal through the ADOUTB terminal (output terminal) is 2T+CT as indicated by the ADOUTB signal waveform in FIG. 2. This delay time starts at the when the CEB signal reaches a voltage value of (VDD2)/2 from the H state and ends at the time when the ADOUTB signal reaches a voltage value of (VDD1)/2 from the H state.

When the AD signal input to the tristate circuit 20 is fixed to the L state (VSS2), the ADOUTB signal is consistently in the H state. In this case, there is no delay time between the release of the voltage conversion circuit 1 from the stand-by state and the outputting of the ADOUTB signal through the ADOUTB terminal (output terminal).

Therefore, a delay time between the release of the voltage conversion circuit 1 from the stand-by state (FIG. 1) and the outputting of the ADOUTB signal (output signal) is 2T+CT at most (worst case).

Figure 9:
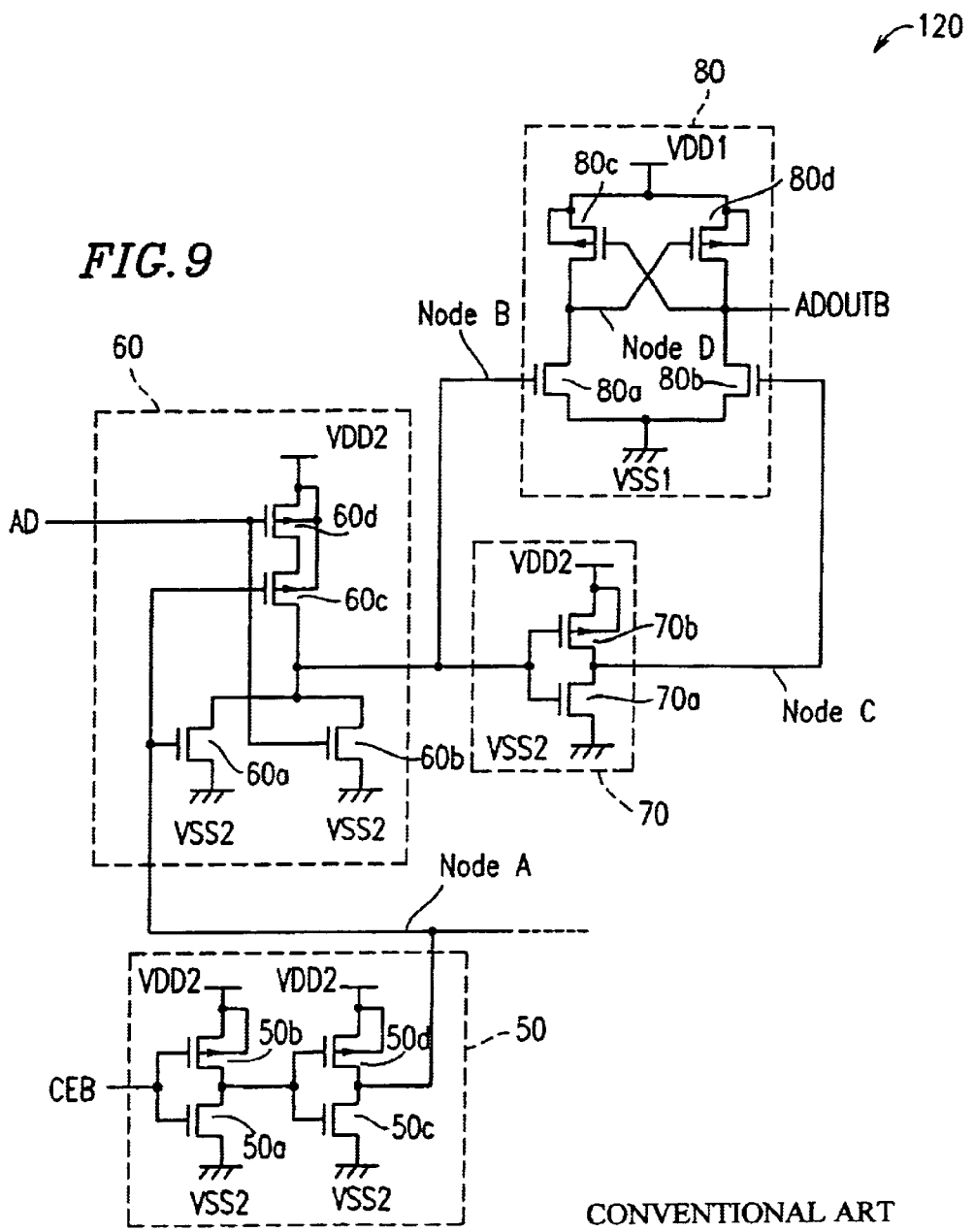
FIG. 9 is a circuit diagram showing another exemplary conventional voltage conversion circuit.
Figure 10:
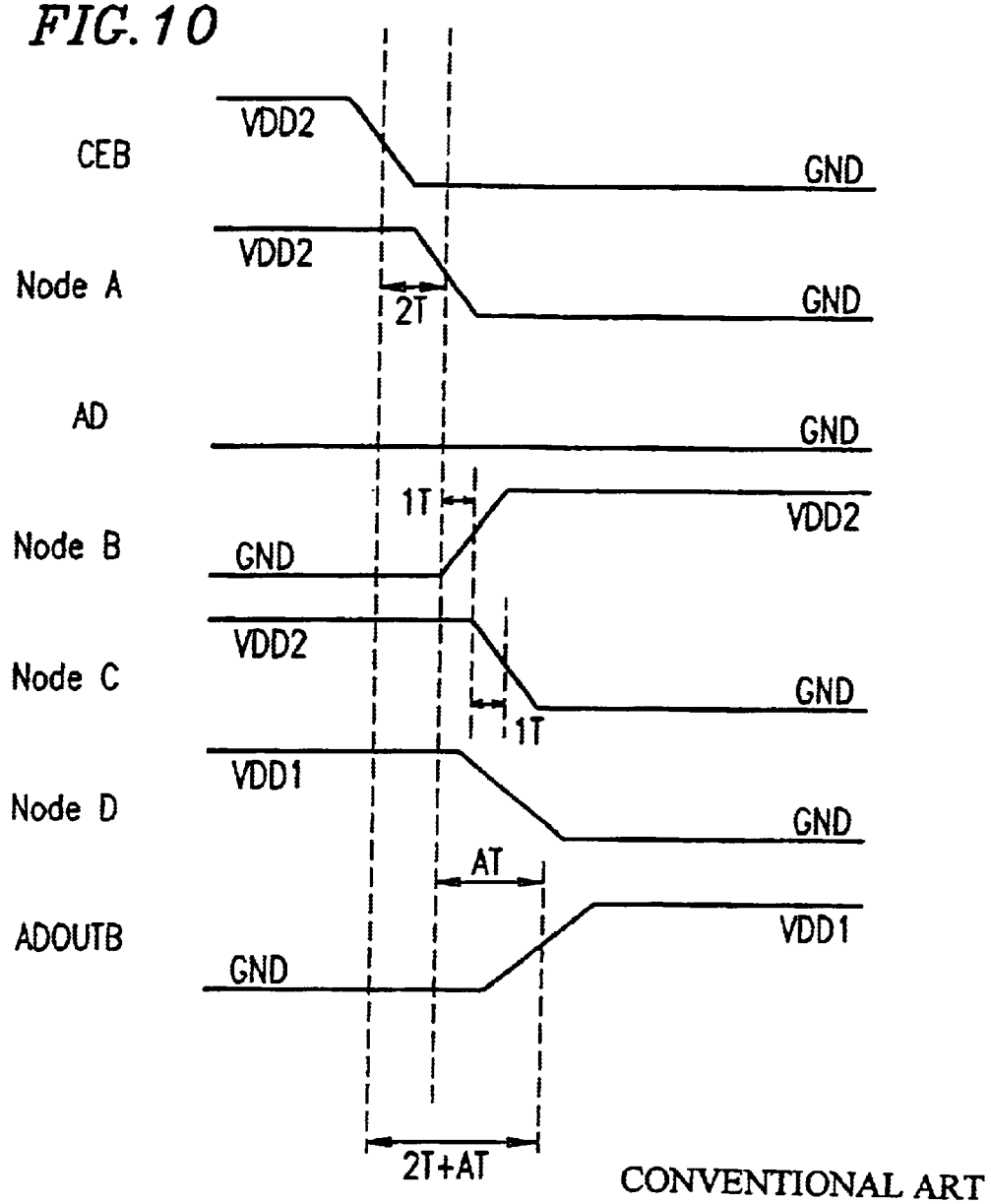
FIG. 10 is a timing chart of signals in the voltage conversion circuit of FIG. 9 in which the voltage conversion circuit is released from the stand-by state.

The delay time CT between the release of the voltage conversion circuit 1 of the present invention from the stand-by state and the voltage transition of the ADOUTB signal in the voltage output circuit 25 is compared with the delay time AT between the release of the voltage conversion circuit 120 (conventional example in FIG. 9) from the stand-by state and the voltage transition of the ADOUTB signal in the voltage output circuit 80 with reference to the timing charts of FIGS. 2 and 10. The following improvement will be appreciated. In the conventional example, the delay time AT starts at the time when the Node B signal waveform (FIG. 10) starts transition and ends at the time when the ADOUTB signal waveform is transitioned in response to the transition of the node D signal waveform, which has been transitioned in response to the transition of the Node B signal waveform. On the other hand, the delay time CT of the present invention starts at the time when the Node C signal waveform (FIG. 2) starts transition and ends at the time when the ADOUTB signal waveform is transitioned in response to the transition of the Node C signal waveform.

As a result, the delay time CT corresponding to a chain of the signal transitions of Node C→ADOUTB is clearly reduced from the delay time AT corresponding to a chain of the signal transitions of Node B→Node D→ADOUTB.

Next, a description will be given of the case where in the voltage conversion circuit 1 in FIG. 1, after the release of the voltage conversion circuit 1 from the stand-by state, the CEB signal input to the buffer circuit 50 is maintained in the L state and the AD signal input to the tristate circuit 20 goes from the L state to the H state.

Figure 3:
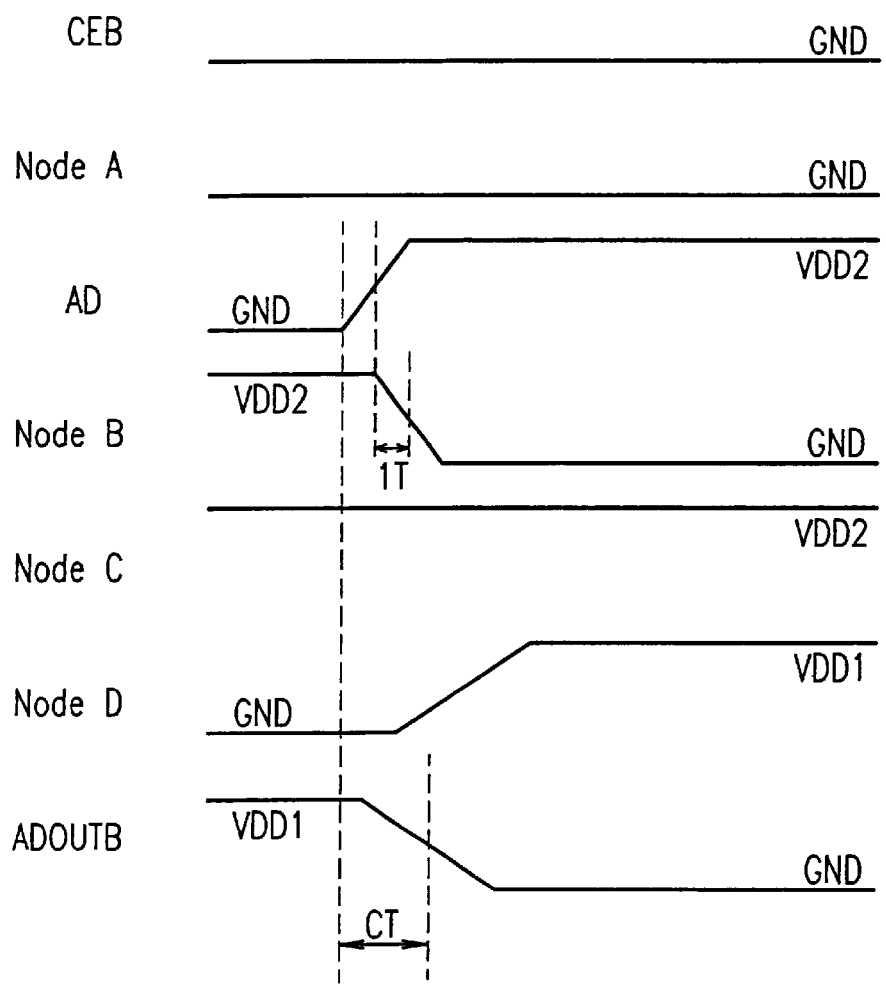
FIG. 3 is a timing chart of signals in the voltage conversion circuit of FIG. 1 in which the voltage conversion circuit is released from the stand-by state and an input signal goes from the L state to the H state.

FIG. 3 is a timing chart showing the CEB signal, the AD signal, the ADOUTB signal and signals on the nodes A, B, C and D when the AD signal goes from the L state to the H state after the release of the voltage conversion circuit 1 of the present invention from the stand-by state. Here, CEB, AD, ADOUTB and Nodes A, B, C and D respectively indicate the signal waveforms of the CEB signal, the AD signal, the ADOUTB signal and the signals on the nodes A, B, C and D (also referred to as node A signal, node B signal, node C signal and node D signal, respectively).

The CEB signal is fixed to the L state (GND) since the voltage conversion circuit 1 has been released from the stand-by state as indicated by CEB of FIG. 3.

The node A signal is in the L state since the CEB signal is in the L state (GND). Therefore, there is no delay time, resulting in an L state signal waveform indicated by Node A in FIG. 3 (in the L state: GND).

The AD signal goes from the L state to the H state, resulting in a signal waveform indicated by AD in FIG. 3 (H state: VDD2, L state: GND).

The node B signal goes from the H state to the L state where the transition is delayed by a delay time (1T) due to the tristate circuit 20 into which the AD signal is input, resulting in a signal waveform indicated by Node B in FIG. 3 (H state: VDD2, L state: GND).

The node C signal is in the H state since the node A signal, which is the input signal of the inverter circuit 15, is in the L state, where there is no delay time, resulting in an H state signal waveform indicated by Node C in FIG. 3 (H state: VDD2).

The signal on the node D connected to the drain terminal of the N-type MOS transistor 25a goes from the L state to the H state in response to the transition of the node B signal waveform from the H state to the L state, resulting in a signal waveform indicated by Node D in FIG. 3 (H state: VDD1, L state: GND).

The ADOUTB signal goes from the H state to the L state in accordance with the timings of the signal waveforms indicated by Node B and Node C in FIG. 3, resulting in a signal waveform indicated by ADOUTB in FIG. 3 (H state: VDD2, L state: GND).

As shown in FIG. 3, the node C signal is fixed to the H state, where there is no delay time. In the operation of the voltage output circuit 25 of FIG. 1, initially, the AD signal which is to be transitioned from the L state to the H state is input to the gate terminal of the N-type MOS transistor 25b, so that the N-type MOS transistor 25b goes from the OFF state to the ON state. Next, the H state node C signal allows the N-type MOS transistor 25c and the P-type MOS transistor 30a to go to the ON state and the OFF state, respectively. Since the P-type MOS transistor 30a is in the OFF state, it has no influence on the node B signal which is the output signal of the tristate circuit 20. When the N-type MOS transistor 25b and the N-type MOS transistor 25c go to the ON state, the drain terminals of the N-type MOS transistor 25b and the N-type MOS transistor 25c go from the H state to the L state, and the ADOUTB signal output through the ADOUTB terminal of the voltage output circuit 25 also starts to be transitioned from the H state (VDD1) to the L state (GND). In this case, the P-type MOS transistor 25d goes from the OFF state to the ON state. During this transition, the node B signal, which is the output signal of the tristate circuit 20 which receives the AD signal input which is to be transitioned from the L state to the H state, goes from the H state to the L state. In association with this, the N-type MOS transistor 25a goes from the ON state to the OFF state, the signal on the node D connected to the drain terminal of the N-type MOS transistor 25a goes from the L state to the H state. Thereafter, the voltage conversion circuit 1 operates in a manner similar to when the voltage conversion circuit 1 is released from the stand-by state as described above.

As described above, the transition of the ADOUTB signal in the voltage output circuit 25 from the H state to the L state starts from the transition starting point of the AD signal waveform from the L state to the H state (FIG. 3). Therefore, the elapsed time from the starting point is a delay time (CT).

Thus, when the voltage conversion circuit 1 is released from the stand-by state, and thereafter, the AD signal input to the AD terminal (input terminal) goes from the L state to the H state, a delay time between the release and the outputting of the ADOUTB signal through the ADOUTB terminal (output terminal) is measured from the transition starting point of the above-described AD signal waveform from the L state to the H state. Therefore, the delay time is CT as indicated by the ADOUTB signal waveform in FIG. 3. The delay time starts at the time when the AD signal waveform goes from the L state to the H state and ends at the time when the ADOUTB signal reaches a value of (VDD1)/2 from the H state.

Figure 11:
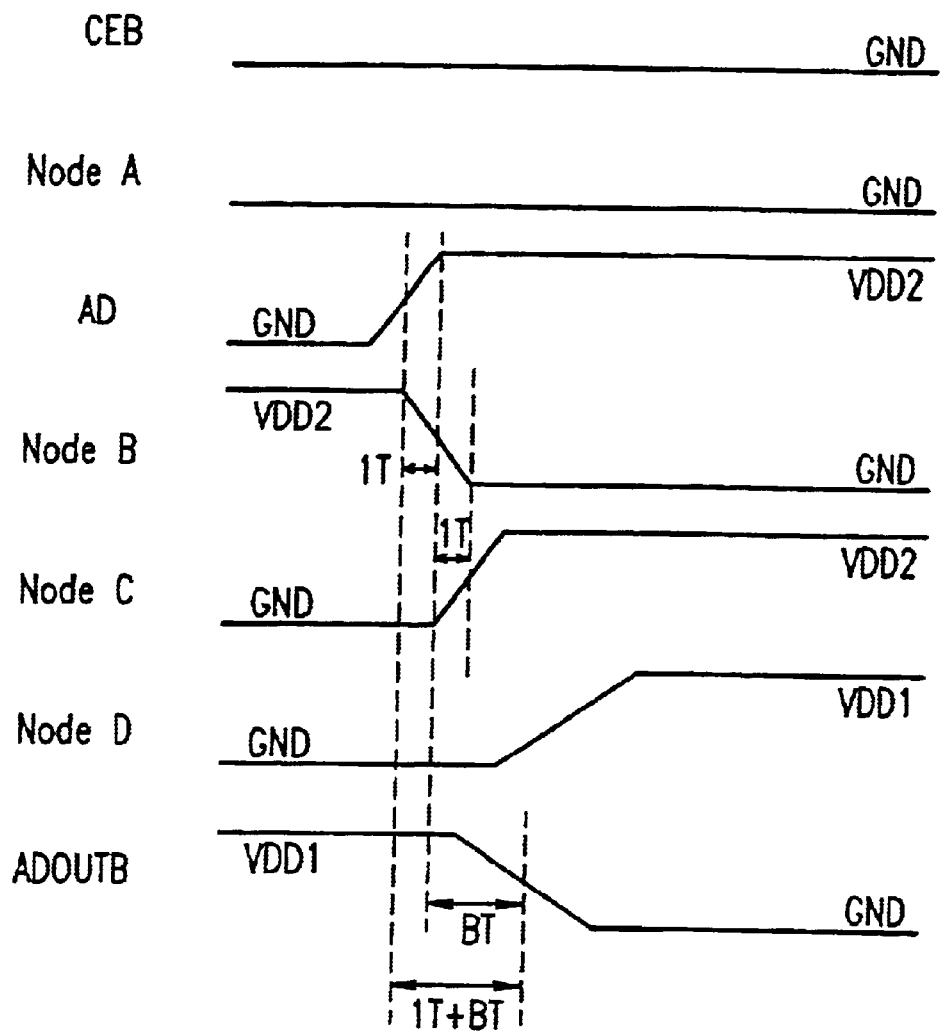
FIG. 11 is a timing chart of signals in the voltage conversion circuit of FIG. 9 in which the voltage conversion circuit is released from the stand-by state and an input signal goes from the L state to the H state.

The delay time CT between the transition of the AD signal input to the tristate circuit 20 from the L state to the H state after the release of the voltage conversion circuit 1 of the present invention from the stand-by state and the voltage transition of the ADOUTB signal in the voltage output circuit 25, is compared with the delay time 1T+BT between the transition of the AD signal input to the NOR circuit 60 from the L state to the H state after the release of the voltage conversion circuit 120 (conventional example in FIG. 9) from the stand-by state and the voltage transition of the ADOUTB signal in the voltage output circuit 80, with reference to the timing charts of FIGS. 3 and 11. The following improvement will be appreciated. In the conventional example, the delay time AT starts at the time when the AD signal turns the state (FIG. 11) and ends at the time when the ADOUTB signal turns the state in response to the transition of the node C signal waveform. On the other hand, the delay time CT of the present invention starts at the time when the AD signal (FIG. 3) turns the state and ends at the time when the ADOUTB signal turns the state immediately in response to the transition of the AD signal waveform.

As a result, the delay time CT corresponding to a chain of the signal transitions of AD→ADOUTB is clearly reduced from the delay time 1T+BT corresponding to a chain of the signal transitions of AD→Node C→ADOUTB.

Next, a description will be given of the case where in the voltage conversion circuit 1 in FIG. 1, after the release of the voltage conversion circuit 1 from the stand-by state, the CEB signal input to the buffer circuit 50 is maintained in the L state and the AD signal input to the tristate circuit 20 goes from the H state to the L state.

Figure 4:
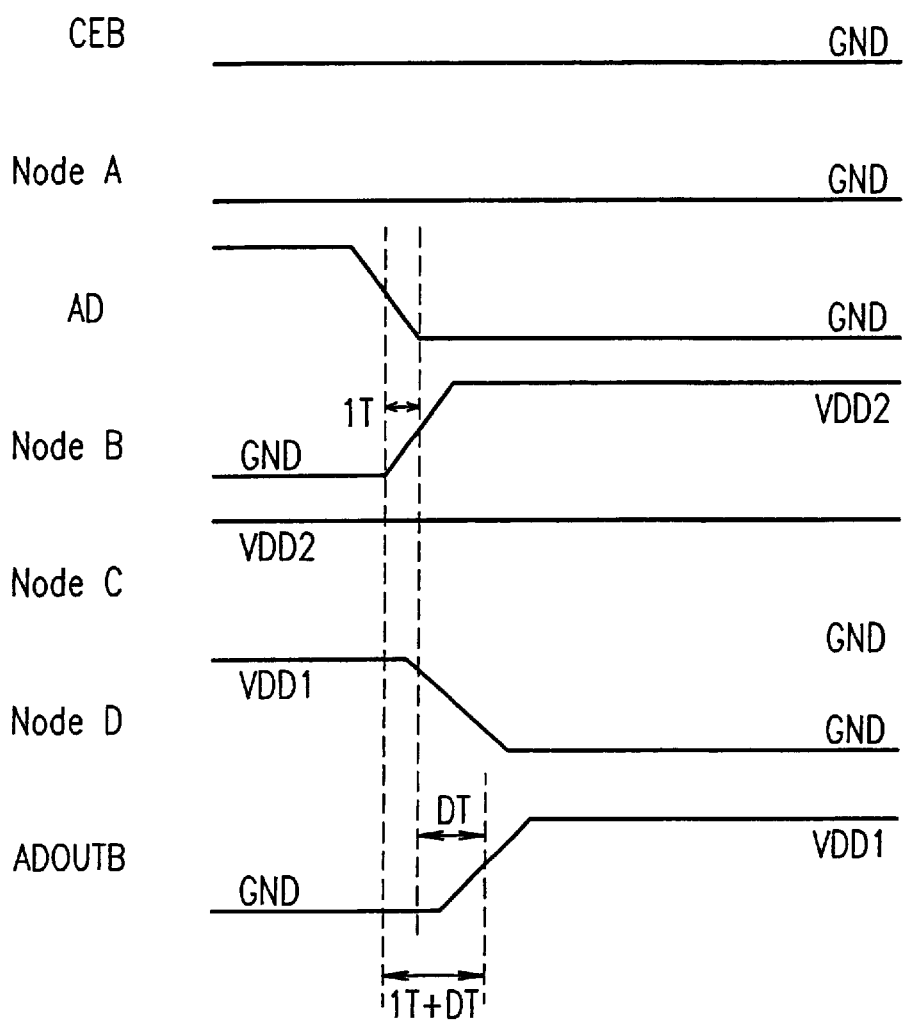
FIG. 4 is a timing chart of signals in the voltage conversion circuit of FIG. 1 in which the voltage conversion circuit is released from the stand-by state and an input signal goes from the H state to the L state.

FIG. 4 is a timing chart showing the CEB signal, the AD signal, the ADOUTB signal and signals on the nodes A, B, C and D when the AD signal goes from the H state to the L state after the release of the voltage conversion circuit 1 of the present invention from the stand-by state. Here, CEB, AD, ADOUTB and Nodes A, B, C and D respectively indicate the signal waveforms of the CEB signal, the AD signal, the ADOUTB signal and the signals on the nodes A, B, C and D (also referred to as node A signal, node B signal, node C signal and node D signal, respectively).

The CEB signal is fixed to the L state (GND) since the voltage conversion circuit 1 has been released from the stand-by state as indicated by CEB of FIG. 4.

The node A signal is in the L state since the CEB signal is in the L state (GND). Therefore, there is no delay time, resulting in an L state signal waveform indicated by Node A in FIG. 4 (in the L state: GND).

The AD signal goes from the H state to the L state, resulting in a signal waveform indicated by AD in FIG. 4 (H state: VDD2, L state: GND).

The node B signal goes from the L state to the H state where the transition is delayed by a delay time (1T) due to the tristate circuit 20 into which the AD signal is input, resulting in a signal waveform indicated by Node B in FIG. 4 (H state: VDD2, L state: GND).

The node C signal is in the H state since the node A signal, which is the input signal of the inverter circuit 15, is in the L state, where there is no delay time, resulting in an H state signal waveform indicated by Node C in FIG. 4 (H state: VDD2).

The signal on the node D connected to the drain terminal of the N-type MOS transistor 25a goes from the H state to the L state in response to the transition of the node B signal waveform from the L state to the H state, resulting in a signal waveform indicated by Node D in FIG. 4 (H state: VDD1, L state: GND).

The ADOUTB signal goes from the L state to the H state in accordance with the timings of the signal waveforms indicated by Node B and Node C in FIG. 4, resulting in a signal waveform indicated by ADOUTB in FIG. 4 (H state: VDD2, L state: GND).

As shown in FIG. 4, the node C signal is maintained in the H state, where there is no delay time. In the operation of the voltage output circuit 25 of FIG. 1, initially, the AD signal which is to be transitioned from the H state to the L state is input to the gate terminal of the N-type MOS transistor 25b, so that the N-type MOS transistor 25b goes from the ON state to the OFF state. Next, the H state node C signal allows the N-type MOS transistor 25c and the P-type MOS transistor 30a to go to the ON state and the OFF state, respectively. Since the P-type MOS transistor 30a is in the OFF state, it has no influence on the node B signal which is the output signal of the tristate circuit 20.

When the AD signal goes from the H state to the L state, the node B signal, which is the output signal of the tristate circuit 20 receiving the AD signal, goes from the L state to the H state. In association with this, the N-type MOS transistor 25a goes from the OFF state to the ON state, and the signal on the node D connected to the drain terminal of the N-type MOS transistor 25a goes from the H state to the L state. In this case, the drain terminal of the N-type MOS transistor 25c goes to the same potential as that of the drain terminal of the N-type MOS transistor 25b.

When the node D signal goes to the L state, the P-type MOS transistor 25e goes to the ON state. In this case, the power source voltage VDD1 is applied to the drain terminal of the N-type MOS transistor 25c, so that the ADOUTB signal output through the ADOUTB terminal also starts to be transitioned from the L state (GND) to the H state (VDD1). Then, the P-type MOS transistor 25d goes from the ON state to the OFF state.

As described above, the ADOUTB signal in the voltage output circuit 25 starts transition from the L state to the H state when the AD signal waveform turns from the H state to the L state (FIG. 4). The elapsed time from the starting point is a delay time (DT).

Therefore, the delay time between the transition of the AD signal input through the AD terminal (input terminal) from the H state to the L state after the release of the voltage conversion circuit 1 from the stand-by state and the outputting of the ADOUTB signal through the ADOUTB terminal (output terminal), is 1T+DT as indicated by the ADOUTB signal waveform in FIG. 4. The delay time starts at the time when the AD signal reaches a voltage of (VDD2)/2 from the H state and ends at the time ADOUTB signal reaches a voltage of (VDD1)/2 from the L state (GND).

Figure 12:
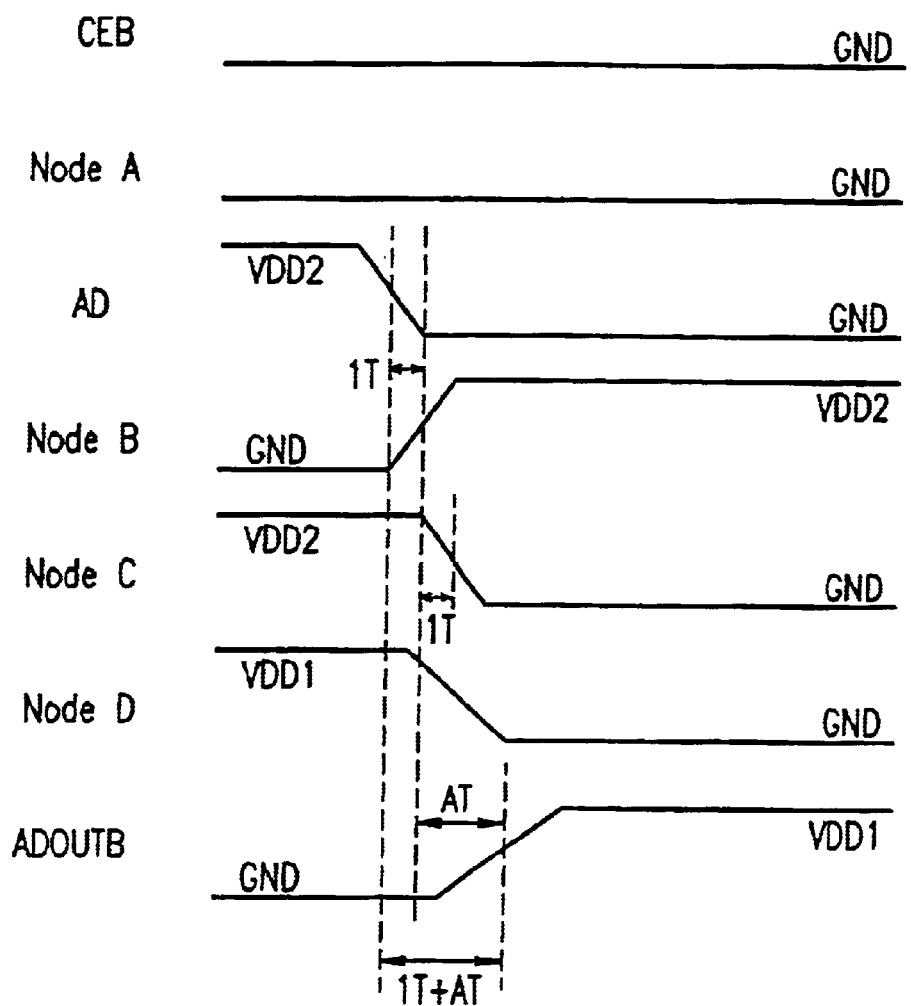
FIG. 12 is a timing chart of signals in the voltage conversion circuit of FIG. 9 in which the voltage conversion circuit is released from the stand-by state and an input signal goes from the H state to the L state.

The delay time 1T+DT between the transition of the AD signal input to the tristate circuit 20 from the H state to the L state after the release of the voltage conversion circuit 1 of the present invention from the stand-by state and the voltage transition of the ADOUTB signal in the voltage output circuit 25, is compared with the delay time 1T+AT between the transition of the AD signal input to the NOR circuit 60 from the H state to the L state after the release of the voltage conversion circuit 120 (conventional example in FIG. 9) from the stand-by state and the voltage transition of the ADOUTB signal in the voltage output circuit 80, with reference to the timing charts of FIGS. 4 and 12. The following improvement will be appreciated. In the conventional example, the delay time 1T+AT starts at the time when the AD signal turns the state (FIG. 12) and ends at the time when the ADOUTB signal turns the state in response to the transition of the node C signal waveform. On the other hand, the delay time 1T+DT of the present invention starts at the time when the AD signal (FIG. 4) turns the state, and after the N-type MOS transistor 25b is completely turned OFF in response to the transition of the AD signal waveform, ends at the time when the ADOUTB signal turns the state.

As a result, the delay time 1T+DT corresponding to a chain of the signal transitions of AD→ADOUTB is clearly reduced from the delay time 1T+AT corresponding to a chain of the signal transitions of AD→Node C→ADOUTB.

According to the above-described configuration, the voltage conversion circuit 1 of the present invention of FIG. 1 can have a reduced delay time between the input signal and the output signal and a high access speed in terms of signal transmission as compared to the conventional voltage conversion circuit 120 of FIG. 9.

Note that although in actual voltage conversion circuits, the delay time between an input signal and an output signal is determined depending on the transistor size, the wiring between circuit devices, and the like, it will be appreciated from the above-described embodiments of the present invention that the voltage conversion circuit 1 can have a substantially reduced delay time as compared to the voltage conversion circuit 120 of FIG. 9.

Figure 5:
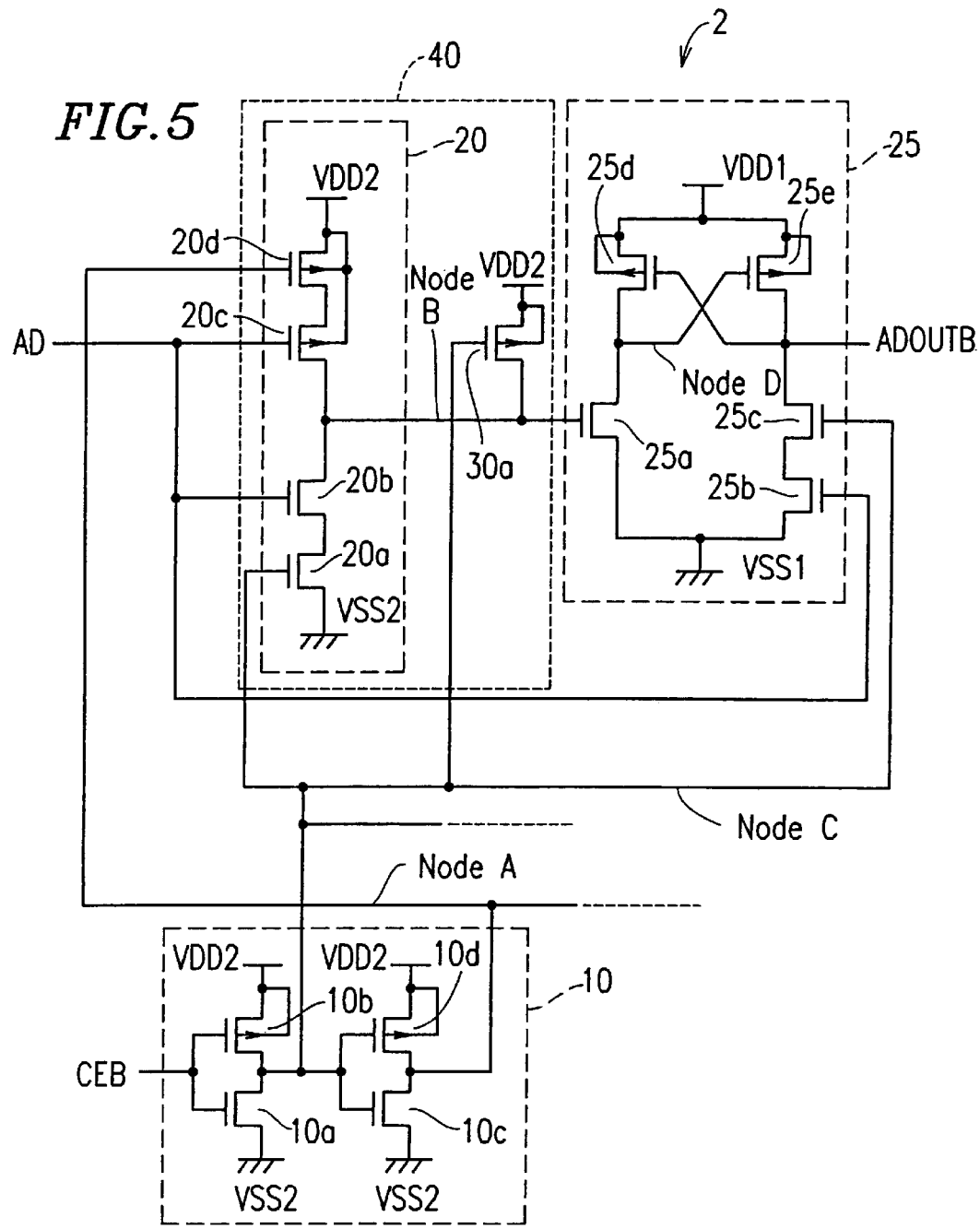
FIG. 5 is a circuit diagram showing a voltage conversion circuit according to another embodiment of the present invention.

FIG. 5 is a circuit diagram showing a voltage conversion circuit 2 according to another embodiment of the present invention. The voltage conversion circuit 2 of FIG. 5 has the same configuration as that of the voltage conversion circuit 1 of FIG. 1, except that the voltage conversion circuit 2 is not provided with the inverter circuit 15 of the voltage conversion circuit 1 of FIG. 1.

In the voltage conversion circuit 2 of FIG. 5, the output terminal of a first stage inverter circuit comprising a P-type MOS transistor 10b and an N-type MOS transistor 10a in a buffer circuit 10 is connected to a node C. The first stage inverter circuit of the buffer circuit 10 in the voltage conversion circuit 2 has the same function as that of the inverter circuit 15 in the voltage conversion circuit 1 of FIG. 1. Specifically, the output signal of the first stage inverter circuit in the buffer circuit 10 is supplied via the node C to the gate terminals of an N-type MOS transistor 20a in a tristate circuit 20, a pull-up P-type MOS transistor 30a, and an N-type MOS transistor 25c in a voltage output circuit 25.

According to the above-described configuration, the voltage conversion circuit 2 of FIG. 5 has the same effect as that of the voltage conversion circuit 1 of FIG. 1, and can have a further reduced delay time between an input signal and an output signal and a higher access speed in terms of signal transmission as compared to the voltage conversion circuit 1 depending on the circuit size and the wiring layout.

Figure 6:
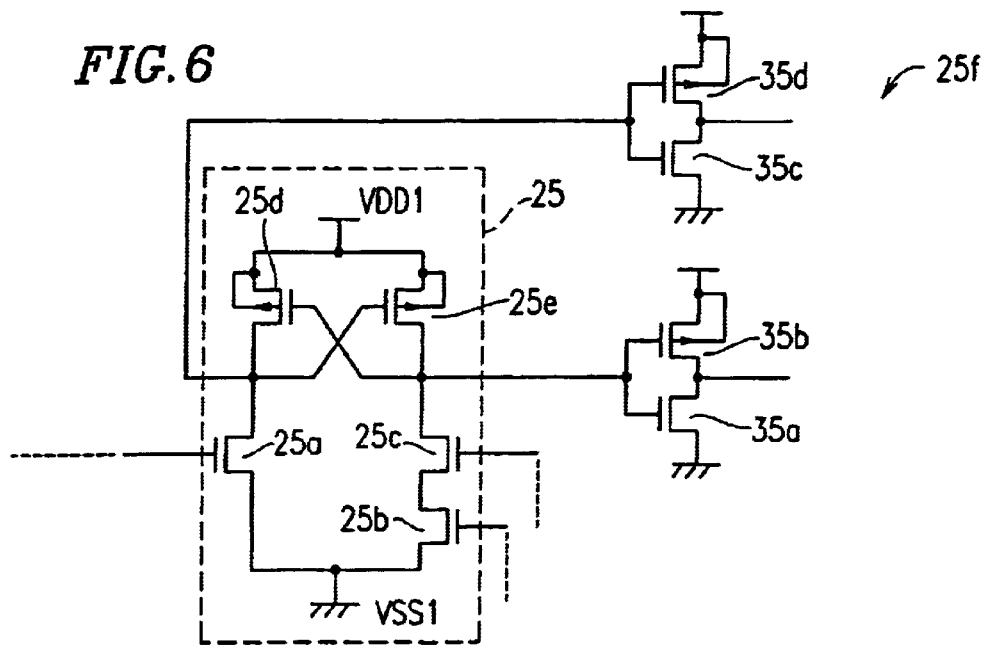
FIG. 6 is a circuit diagram showing the voltage conversion circuits of FIGS. 1 and 5 which are each provided with two output terminals.
Figure 7:
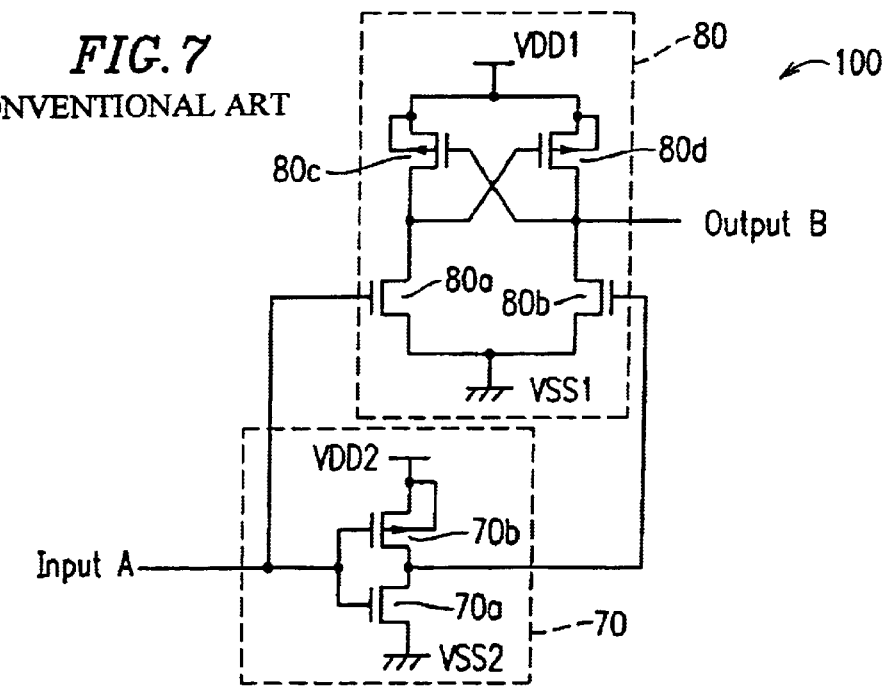
FIG. 7 is a circuit diagram showing a conventional voltage conversion circuit.
Figure 8:
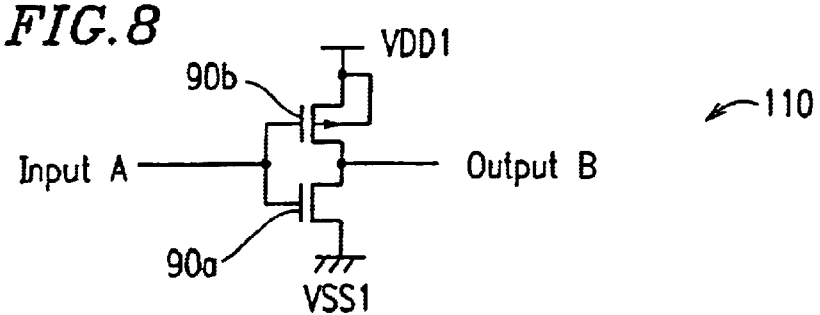
FIG. 8 is a circuit diagram showing an inverter circuit.

FIG. 6 is a circuit diagram of a voltage output circuit 25*f* in which an inverter circuit is connected to each of the ADOUTB terminal of the voltage output circuit 25 and the drain terminals of the P-type MOS transistor 25*d* and the N-type MOS transistor 25*a* on the node D in the voltage conversion circuits 1 and 2 of the present invention. The two inverter circuits output signals having a different polarity by controlling inverted voltages.

The inverter circuit connected to the ADOUTB terminal of the voltage output circuit 25*f* comprises a P-type MOS transistor 35*b* and an N-type MOS transistor 35*a*. The inverter circuit connected to the drain terminals of the P-type MOS transistor 25*d* and the N-type MOS transistor 25*a* on the node D, comprises a P-type MOS transistor 35*d* and an N-type MOS transistor 35*c*.

Thus, the voltage conversion circuits 1 and 2 having the voltage output circuit 25*f* in FIG. 6 each have two output terminals and can output two output signals having a different polarity simultaneously. As a result, the voltage conversion circuits 1 and 2 each can output an input signal to a plurality of circuit blocks, thereby making it possible to provide multiple functions.

By providing the voltage conversion circuit 1 or 2 between a plurality of circuit blocks, such as LSIs or like, a semiconductor device having multiple functions can be obtained.

In the voltage conversion circuit of the present invention, the voltage output circuit starts generating an output signal based on an input signal and an inverted signal before receiving an operation signal or a stand-by signal output by the logic circuit. Thus, the signal waveform of an output signal of the voltage conversion circuit starts transition in response to the transition of the signal waveforms of the input signal and the inverted signal, thereby making it possible to reduce a delay time.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A voltage conversion circuit for converting the voltage of an input signal to the voltage of an output signal, comprising:

a logic circuit for outputting an operation signal obtained by inverting and delaying the input signal based on a stand-by/operation control signal and an inverted signal having a polarity inverse to the stand-by/operation control signal or a stand-by signal obtained by delaying the input signal relative to the inverted signal based on the inverted signal; and a voltage output circuit for starting generating the output signal based on the input signal and the inverted signal before receiving the operation signal or the stand-by signal output by the logic circuit.

2. A voltage conversion circuit according to claim 1, further comprising:

a control circuit for generating the stand-by/operation control signal.

3. A voltage conversion circuit according to claim 2, wherein the control circuit comprises:

a first inversion control circuit for generating the inverted signal; and a second inversion control circuit for generating the stand-by/operation control signal by inverting the inverted signal.

4. A voltage conversion circuit according to claim 1, further comprising:

an inversion circuit for generating the inverted signal by inverting the stand-by/operation control signal.

5. A voltage conversion circuit according to claim 1, wherein the logic circuit comprises:

a ternary logic circuit for generating the operation signal corresponding to the input signal based on the stand-by/operation control signal and the inverted signal; and a pull-up circuit for generating the stand-by signal based on the inverted signal.

6. A voltage conversion circuit according to claim 5, wherein the ternary logic circuit comprises:

a first P-type MOS transistor having a gate terminal through which the input signal is input, a source terminal, and a drain terminal;

a second P-type MOS transistor having a gate terminal through which the stand-by/operation signal is input, a source terminal connected to a power source, and a drain terminal connected to the source terminal of the first P-type MOS transistor;

a first N-type MOS transistor having a gate terminal through which the input signal is input, a source terminal, and a drain terminal connected to the drain terminal of the first P-type MOS transistor; and a second N-type MOS transistor having a gate terminal through which the inverted signal is input, a source terminal connected to ground, and a drain terminal connected to the source terminal of the first N-type MOS transistor, wherein the first P-type MOS transistor and the first N-type MOS transistor function as a CMOS inverter.

7. A voltage conversion circuit according to claim 6, wherein:

the voltage output circuit further comprises a first output terminal and a second terminal; and the polarity of an output signal output through the first output terminal is opposite to the polarity of an output signal output through the second output terminal.

8. A voltage conversion circuit according to claim 1, wherein the voltage output circuit comprises:

a third P-type MOS transistor having a gate terminal, a source terminal connected to a power source, and a drain terminal;

a fourth P-type MOS transistor having a gate terminal, a source terminal connected to the power source, and a drain terminal connected to the gate terminal of the third P-type MOS transistor; a third N-type MOS transistor having a gate terminal through which the inverted signal is input, a source terminal, and a drain terminal connected to the drain terminal of the third P-type MOS transistor; a fourth N-type MOS transistor having a gate terminal through which the input signal is input, a source terminal connected to ground, and a drain terminal connected to the source terminal of the third N-type MOS transistor; and a fifth N-type MOS transistor having a gate terminal through which the operation signal or the stand-by signal is input, a source terminal connected to ground, and a drain terminal connected to the drain terminal of the third P-type MOS transistor.

9. A semiconductor device, incorporating a voltage conversion circuit for converting the voltage of an input signal to the voltage of an output signal, comprising:

a logic circuit for outputting an operation signal obtained by inverting and delaying the input signal based on a stand-by/operation control signal and an inverted signal having a polarity inverse to the stand-by/operation control signal or a stand-by signal obtained by delaying the input signal relative to the inverted signal based on the inverted signal; and a voltage output circuit for starting generating the output signal based on the input signal and the inverted signal before receiving the operation signal or the stand-by signal output by the logic circuit.

* * * * *